(12) United States Patent
Cheng et al.

(10) Patent No.: US 7,772,649 B2
(45) Date of Patent: Aug. 10, 2010

(54) SOI FIELD EFFECT TRANSISTOR WITH A BACK GATE FOR MODULATING A FLOATING BODY

(75) Inventors: Kangguo Cheng, Guilderland, NY (US);
Louis C. Hsu, Fishkill, NY (US); Jack A. Mandelman, Flat Rock, NC (US);
Carl Radens, Lagrangeville, NY (US);
William Tonti, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 233 days.

(21) Appl. No.: 12/036,325

(22) Filed: Feb. 25, 2008

(65) Prior Publication Data

US 2009/0212362 A1    Aug. 27, 2009

(51) Int. Cl.
*H01L 27/01* (2006.01)
*H01L 27/12* (2006.01)
*H01L 31/0392* (2006.01)

(52) U.S. Cl. .............. 257/354; 257/316; 257/347; 257/365; 257/366; 257/E29.275; 257/E29.283; 257/E27.112; 257/E21.415; 257/E21.703

(58) Field of Classification Search ................. 257/316, 257/347, 354, 365, 366, E29.275, E29.283, 257/E27.112, E21.415, E21.703
See application file for complete search history.

(56) References Cited

U.S. PATENT DOCUMENTS 6,621,725 B2    9/2003    Ohsawa 7,187,581 B2    3/2007    Ferrant et al.
7,205,185 B2 *  4/2007    Dokumaci et al. .......... 438/197
2006/0125011 A1  6/2006   Chang

OTHER PUBLICATIONS

Ban et al., "Floating Body Cell with Independently-Controlled Double Gates for High Density Memory", 2006 IEEE.
Nemati et al., "Fully Planar 0.562um2 T-RAM Cell in a 130nm SOI CMOS Logic Technology for High-Density High-Performance SRAMs", 2004 IEEE.
Ranica et al., "A capacitor-less DRAM cell on 75nm gate length, 16nm thin Fully Depleted SOI device for high density embedded memories", 2004 IEEE.

(Continued)

*Primary Examiner*—Long K Tran
(74) *Attorney, Agent, or Firm*—Scully, Scott, Murphy & Presser, P.C.; H. Daniel Schnurmann

(57) ABSTRACT

A masking layer is applied over a top semiconductor layer and patterned to expose in an opening a shallow trench isolation structure and a portion of a top semiconductor region within which a first source/drain region and a body is to be formed. Ions are implanted into a portion of a buried insulator layer within the area of the opening to form damaged buried insulator region. The shallow trench isolation structure is removed and the damaged buried insulator region is etched selective to undamaged buried insulator portions to form a cavity. A dielectric layer is formed on the sidewalls and the exposed bottom surface of the top semiconductor region and a back gate filling the cavity is formed. A contact is formed to provide an electrical bias to the back gate so that the electrical potential of the body and the first source/drain region is electrically modulated.

14 Claims, 24 Drawing Sheets

OTHER PUBLICATIONS

Minami, et al., "Floating Body Cell (FBC) fully Compatible with 90nm CMOS Technology (CMOS IV) for 128Mb SOI DRAM", 2005 IEEE.

Shino, et al., "Floating Body RAM Technology and its Scalability to 32nm Node and Beyond", 2006 IEEE.

* cited by examiner

SOI FIELD EFFECT TRANSISTOR WITH A BACK GATE FOR MODULATING A FLOATING BODY

FIELD OF THE INVENTION

The present invention relates to semiconductor devices, and particularly to a semiconductor-on-insulator (SOI) field effect transistor with a back gate for modulating a floating body and methods of manufacturing the same.

BACKGROUND OF THE INVENTION

Semiconductor devices formed on a semiconductor-on-insulator (SOI) substrate provide advantages in performance since a buried insulator layer separating a handle substrate and a top semiconductor layer provides reduced capacitive coupling between devices formed on the top semiconductor layer and the handle substrate. For example, the dielectric constant of silicon is about 11.68, while the dielectric constant of silicon oxide is about 3.9. Since capacitive coupling between a semiconductor device and the semiconductor substrate containing the semiconductor device is proportional to the dielectric constant, or the relative permittivity, of the material comprising the semiconductor substrate, a semiconductor device formed on an SOI substrate may provide performance advantage, and alternatively or concurrently, lower power consumption.

However, SOI field effect transistors in general suffer from floating body effects. The body of an SOI field effect transistor stores electrical charge as a function of the history of the device, hence changing the body voltage accordingly and becoming a "floating" body. As such, an SOI field effect transistor has threshold voltages which are difficult to anticipate and control, and which vary in time. The body charge storage effects result in dynamic sub-threshold voltage (sub-Vt) leakage and threshold voltage (Vt) mismatch among geometrically identical adjacent devices. Floating body effects in an SOI field effect transistor are particularly a concern in static random access memory (SRAM) cells, where Vt matching is extremely important as operating voltages continue to be scaled down. Another concern with the SOI field effect transistor is with stacked devices, as used in logic gates, in which the conductive state of devices higher up in the stack are strongly influenced by stored body charge, because of reduced gate-to-source voltage (Vgs) overdrive available to these devices.

While it may be desirable to employ conventional SOI field effect transistors for some devices in a semiconductor circuit, a field effect transistor with pre-determined body voltage is also desired on the same SOI substrate for some other devices. For example, it is desired to have a controllable body voltage in a floating body memory device.

In view of the above, there exists a need for a field effect transistor having a controllable body voltage that may be formed on an SOI substrate. Further, there exists a need for such an SOI field effect transistor having a controllable body voltage formed on the same SOI substrate containing a conventional SOI field effect transistor having typical floating body effects. Yet further, there exist a need for manufacturing such an SOI field effect transistor having a controllable body voltage—either alone or in conjunction with a conventional SOI field effect transistor having typical floating body effects.

SUMMARY OF THE INVENTION

The present invention addresses the needs described above by providing an SOI field effect transistor having a back gate that modulates one of source and drain regions and a body, and methods of manufacturing the same.

In the present invention, a masking layer is applied over a top semiconductor layer and patterned to expose in an opening a shallow trench isolation structure and a portion of a top semiconductor region within which a first source/drain region and a body is to be formed. Ions are implanted into a portion of a buried insulator layer within the area of the opening to form a damaged buried insulator region. The shallow trench isolation structure is removed and the damaged buried insulator region is etched selective to undamaged buried insulator portions to form a cavity. A dielectric layer is formed on the sidewalls and the exposed bottom surface of the top semiconductor region and a back gate filling the cavity is formed. A contact is formed to provide an electrical bias to the back gate so that the electrical potential of the body is electrically modulated.

According to an aspect of the present invention, a semiconductor structure is provided, which comprises:

a handle substrate;

a buried insulator portion having at least one hole and located directly on the handle substrate;

a field effect transistor comprising a source region, a drain region, and a body region that are located in a top semiconductor portion that vertically abuts the buried insulator portion;

a dielectric layer located in the hole and abutting the body and one of the source region and the drain region;

a back gate electrode abutted and surrounded by the dielectric layer; and a conductive contact via abutting the back gate electrode.

The dielectric layer may laterally abut sidewalls of the buried insulator portion. Further, the dielectric layer may vertically abut the handle substrate.

In one embodiment, the semiconductor structure further comprises a shallow trench isolation structure abutting the other of the source region and the drain region.

In another embodiment, the back gate electrode comprises a doped semiconductor material having a doping of p-type or n-type.

In even another embodiment, the semiconductor structure further comprises a dielectric material plug vertically abutting the back gate electrode and surrounding the conductive contact via, wherein the conductive contact via extends below a depth of a bottom surface of the dielectric material plug.

In yet another embodiment, the semiconductor structure further comprises a conductive material plug located between and vertically abutting the back gate electrode and the conductive contact via.

In still another embodiment, the semiconductor structure further comprises a dielectric spacer laterally abutting inner sidewalls of the dielectric layer and outer sidewalls of the conductive material plug.

In still yet another embodiment, the dielectric layer abuts a portion of the other of the source region and the drain region.

In a further embodiment, the dielectric layer is disjoined from the other of the source region and the drain region.

In an even further embodiment, the dielectric layer is contiguous and topologically homomorphic to a bottle with one opening, wherein an opening of the dielectric layer is located at a surface that is substantially coplanar with a top surface of the top semiconductor portion.

According to another aspect of the present invention, a semiconductor structure located in a semiconductor-on-insulator (SOI) substrate and comprising a first field effect transistor and a second field effect transistor therein is provided.

The SOI substrate comprises a handle substrate and a buried insulator portion having at least one hole and located directly on the handle substrate, wherein the first transistor comprises:

a first source region, a first drain region, and a first body region that are located in a first top semiconductor portion abutting the buried insulator portion;

a dielectric layer abutting the first body, one of the first source region and the first drain region, the first buried insulator portion, sidewalls of the buried insulator portion, and the handle substrate;

a back gate electrode abutted and surrounded by the dielectric layer; and a conductive contact via abutting the back gate electrode, and wherein the second transistor comprises a second source region, a second drain region, and a second body region that vertically abut the buried insulator portion and are located in a second top semiconductor portion, wherein the second top semiconductor portion is disjoined from the first top semiconductor portion and from the dielectric layer.

In one embodiment, the back gate electrode comprises a doped semiconductor material having a doping of p-type or n-type.

In another embodiment, the semiconductor structure further comprises a dielectric material plug vertically abutting the back gate electrode and surrounding the conductive contact via, wherein the conductive contact via extends below a depth of a bottom surface of the dielectric material plug.

In yet another embodiment, the semiconductor structure further comprises a conductive material plug located between and vertically abutting the back gate electrode and the conductive contact via.

In still another embodiment, the semiconductor structure further comprises a dielectric spacer laterally abutting inner sidewalls of the dielectric layer and outer sidewalls of the conductive material plug.

According to yet another aspect of the present invention, a method of forming a semiconductor structure is provided, which comprises:

forming a damaged oxide portion by implanting ions into a portion of a buried insulator layer;

removing the shallow trench isolation structure portion and the damaged oxide portion to form a cavity underneath a top semiconductor portion;

forming a dielectric layer on sidewalls of the buried insulator and a bottom surface of the top semiconductor portion;

filling the cavity with a conductive material and forming a back gate electrode abutted and surrounded by the dielectric layer; and forming a body region, a source region, and a drain region a field effect transistor within the top semiconductor portion, wherein the body region and one of the source region and the drain region overlies the back gate electrode.

In one embodiment, the method further comprises:

applying a masking layer over a semiconductor-on-insulator substrate containing the buried insulator layer; and patterning the masking layer to form an opening in which a shallow trench isolation structure portion is exposed, wherein the damaged oxide portion is formed within an area of the opening.

In another embodiment, the method further comprises forming a conductive contact via abutting the back gate electrode.

In even another embodiment, the method further comprises:

recessing the conductive material after the filling of the cavity; and forming a dielectric material plug directly on the back gate electrode prior to forming the conductive contact via, wherein the conductive contact via extends below a depth of a bottom surface of the dielectric material plug.

In yet another embodiment, the method further comprises forming a conductive material plug directly on the back gate electrode, wherein a top surface of the conductive material plug is substantially coplanar with a top surface of the top semiconductor portion, and wherein the conductive contact via vertically abuts the conductive material plug.

In still another embodiment, the method further comprises forming a dielectric spacer laterally abutting inner sidewalls of the dielectric layer and outer sidewalls of the conductive material plug.

DETAILED DESCRIPTION OF THE INVENTION

Figure 1:
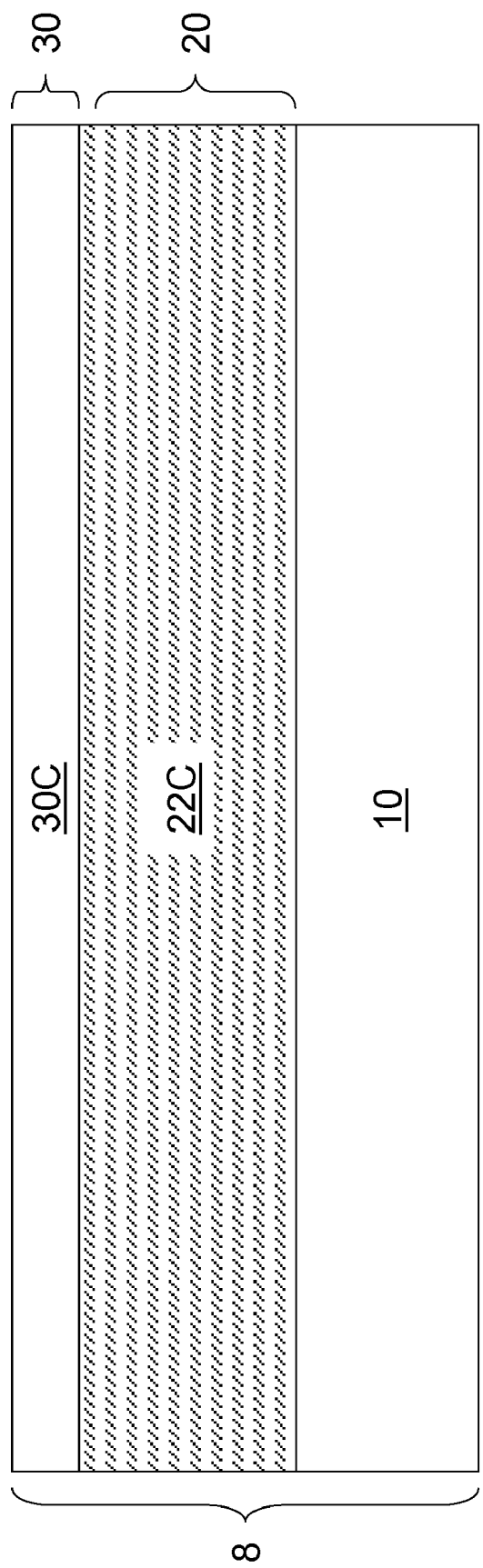
FIGS. 1-6, and 7-11 show sequential vertical cross-sectional views of a first exemplary semiconductor structure according to the present invention.

As stated above, the present invention relates to semiconductor-on-insulator (SOI) field effect transistor with a back gate for modulating a floating body and methods of manufacturing the same, which are now described in detail with accompanying figures. It is noted that like and corresponding elements are referred to by like reference numerals.

Referring to FIG. 1, a first exemplary semiconductor structure according to a first embodiment of the present invention is shown, which comprises a semiconductor-on-insulator (SOI) substrate 8 containing a handle substrate 10, a buried insulator layer 20, and a top semiconductor layer 30. The handle substrate 10 may comprise a semiconductor material, a metallic material, or an insulator material. Typically, the handle substrate 10 comprises a semiconductor material such as silicon. The buried insulator layer 20 comprises silicon oxide, silicon nitride, an insulating metal oxide, an insulating metal nitride, or other ceramic materials and may have a thickness from about 30 nm to about 1,000 nm, and typically from about 60 nm to about 300 nm. As provided, the buried insulator layer 20 comprises a contiguous buried insulator portion 22C that laterally encompasses the entirety of the substrate 8.

The top semiconductor layer 30 comprises a contiguous top semiconductor portion 30C laterally extending over the entirety of the SOI substrate 8 without any hole at this step. The top semiconductor layer 30 comprises a semiconductor material, which may be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. The top semiconductor layer 30 has a thickness from about 5 nm to about 300 nm, and typically from about 20 nm to about 100 nm. Preferably, the contiguous top semiconductor portion 30C is single crystalline, i.e., has the same set of crystallographic orientations, or "epitaxial." The contiguous top semiconductor portion 30C is typically lightly doped, i.e., have a dopant concentration from about $1.0 \times 10^{15}/cm^3$ to about $3.0 \times 10^{18}/cm^3$, and preferably from about $1.0 \times 10^{15}/cm^3$ to about $3.0 \times 10^{17}/cm^3$, although lesser and greater dopant concentrations are explicitly contemplated herein.

Figure 2:
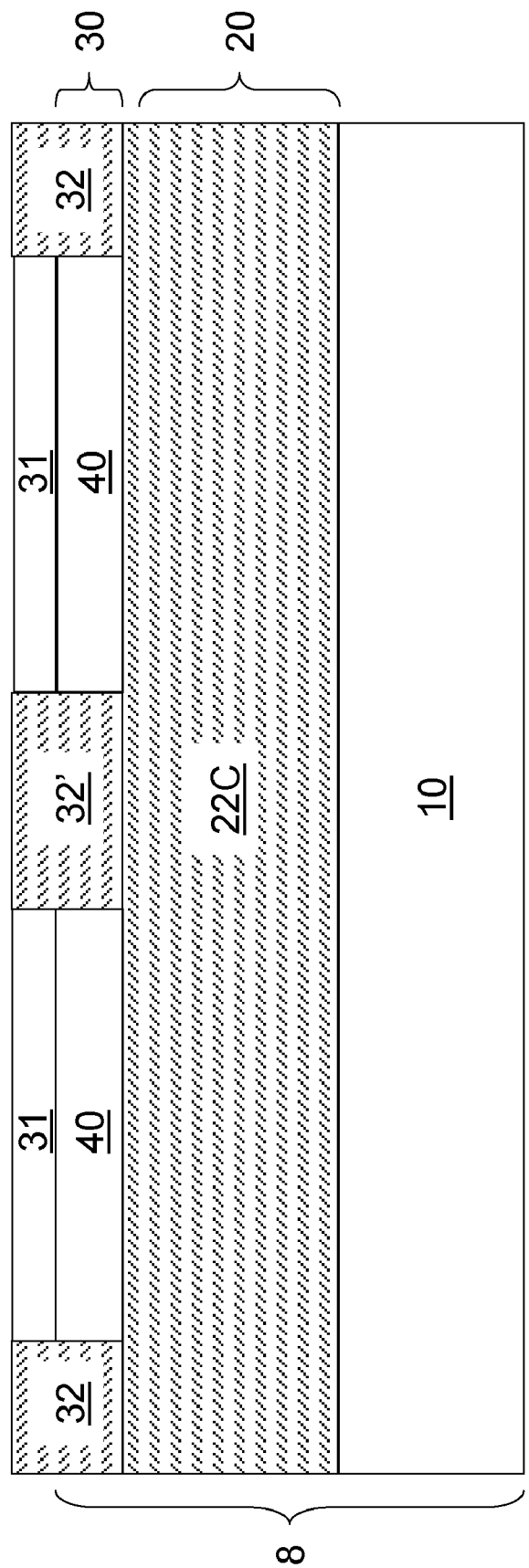

Referring to FIG. 2, at least one dielectric pad layer 31 is formed directly on the top semiconductor layer 30. Typically, the at least one dielectric pad layer 31 comprises a stack of a pad oxide layer comprising silicon oxide and having a thickness from about 3 nm to about 60 nm, and a pad nitride layer comprising silicon nitride and having a thickness from about 30 nm to about 300 nm. A photoresist layer (not shown) is formed on the at least one dielectric pad layer 31 and lithographically patterned to define active semiconductor areas covered by the remaining patterned photoresist layer after development and shallow trench isolation regions in which the at least one dielectric pad layer 31 is exposed. The pattern in the remaining photoresist layer is transferred into the at least one dielectric pad layer 31 and the contiguous top semiconductor portion 30C down to a top surface of the contiguous buried insulator portion 22C. The remaining portions of the contiguous top semiconductor portion 30C constitute top semiconductor portions 40.

A dielectric material such as silicon oxide and/or silicon nitride is deposited into trenches surrounded by the stack of the top semiconductor portions 40 and the at least one pad layer 31. The dielectric material may be deposited by high density plasma chemical vapor deposition (HDPCVD), plasma enhanced physical vapor deposition (PECVD), low pressure chemical vapor deposition (LPCVD), etc. The dielectric material is planarized to form various shallow trench isolation portions including first shallow trench isolation portions 32 and a second shallow trench isolation portion 32'. Top surfaces of the first shallow trench isolation portions 32 and a second shallow trench isolation portion 32' is typically coplanar with top surfaces of the at least one pad layer 31 since the at least one pad layer 31 is employed as a stopping layer during a planarization process. The second shallow trench isolation portion 32' laterally isolates two top semiconductor portions 40 that are disjoined from each other, i.e., the two top semiconductor portions 40 are separated by the second shallow trench isolation portion 32'.

Figure 3:
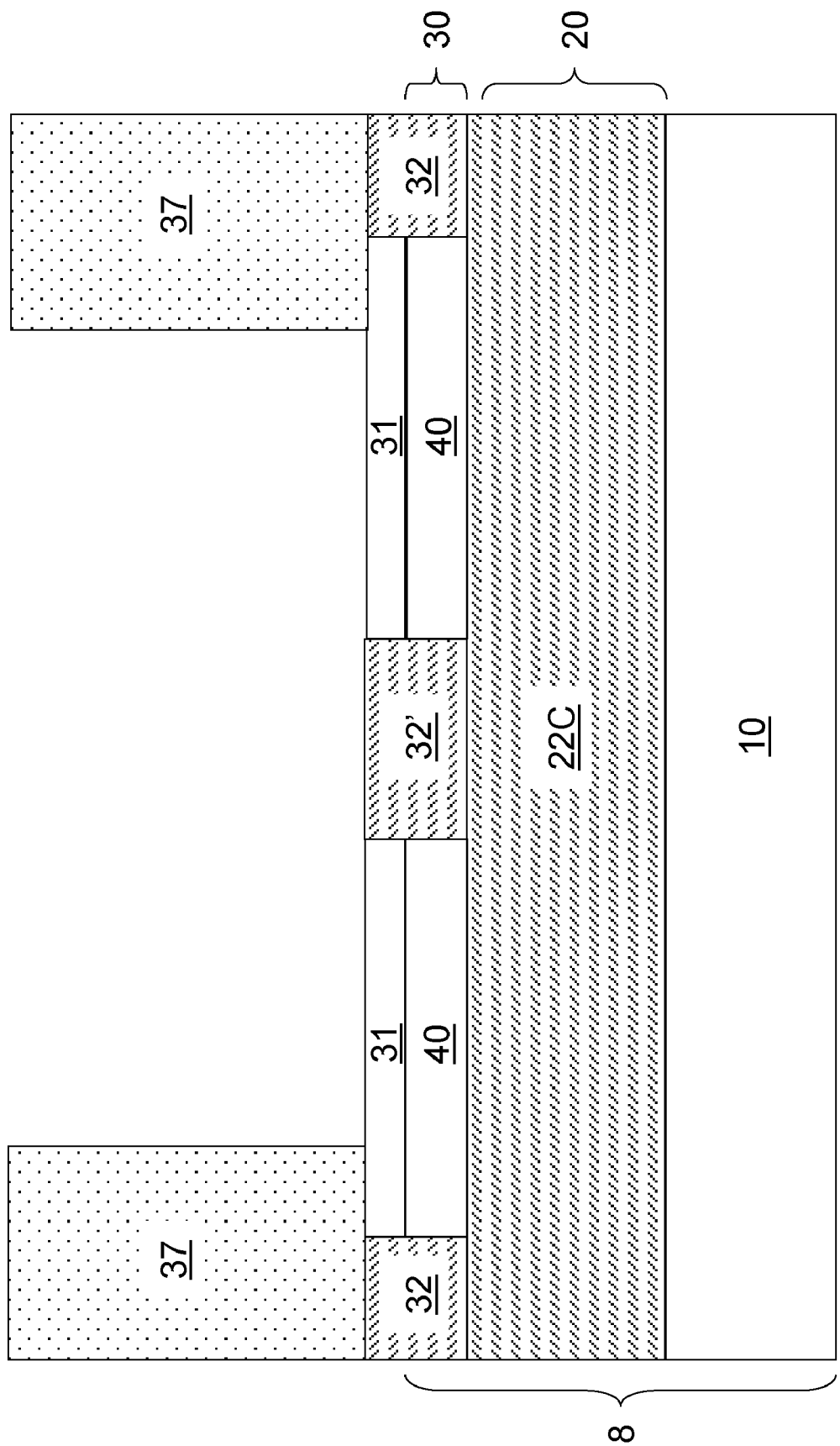

Referring to FIG. 3, a masking layer 37 is formed over the SOI substrate 8 and lithographically patterned. The masking layer 37 may be a soft mask comprising a photoresist, or alternately, may be a hard mask comprising a dielectric material. If the masking layer 37 is a hard mask, a photoresist material is applied over the masking layer 37 to effect patterning of the hard mask layer. The material of the masking layer 37 is different from the materials of the first shallow trench isolation portions 32, the second shallow trench isolation portion, and a top surface of the at least one pad layer 31. After the patterning of the masking layer 37, the second shallow trench isolation portion 32' and first end portions of the at least one pad layer 31, which are adjacent to the second shallow trench isolation portion 32', are exposed. The first shallow trench isolation portions 32 and second end portions of the at least one pad layer 32, which are located farther away from the second shallow trench isolation portion 32' than the first end portions, are covered by the masking layer 37 after the patterning of the masking layer 37. The masking layer 37, as patterned, forms an opening around the second shallow trench isolation portion 32' such that the second shallow trench isolation portion 32' and the first end portions of the at least one pad layer 31 are exposed within the opening.

Figure 4:
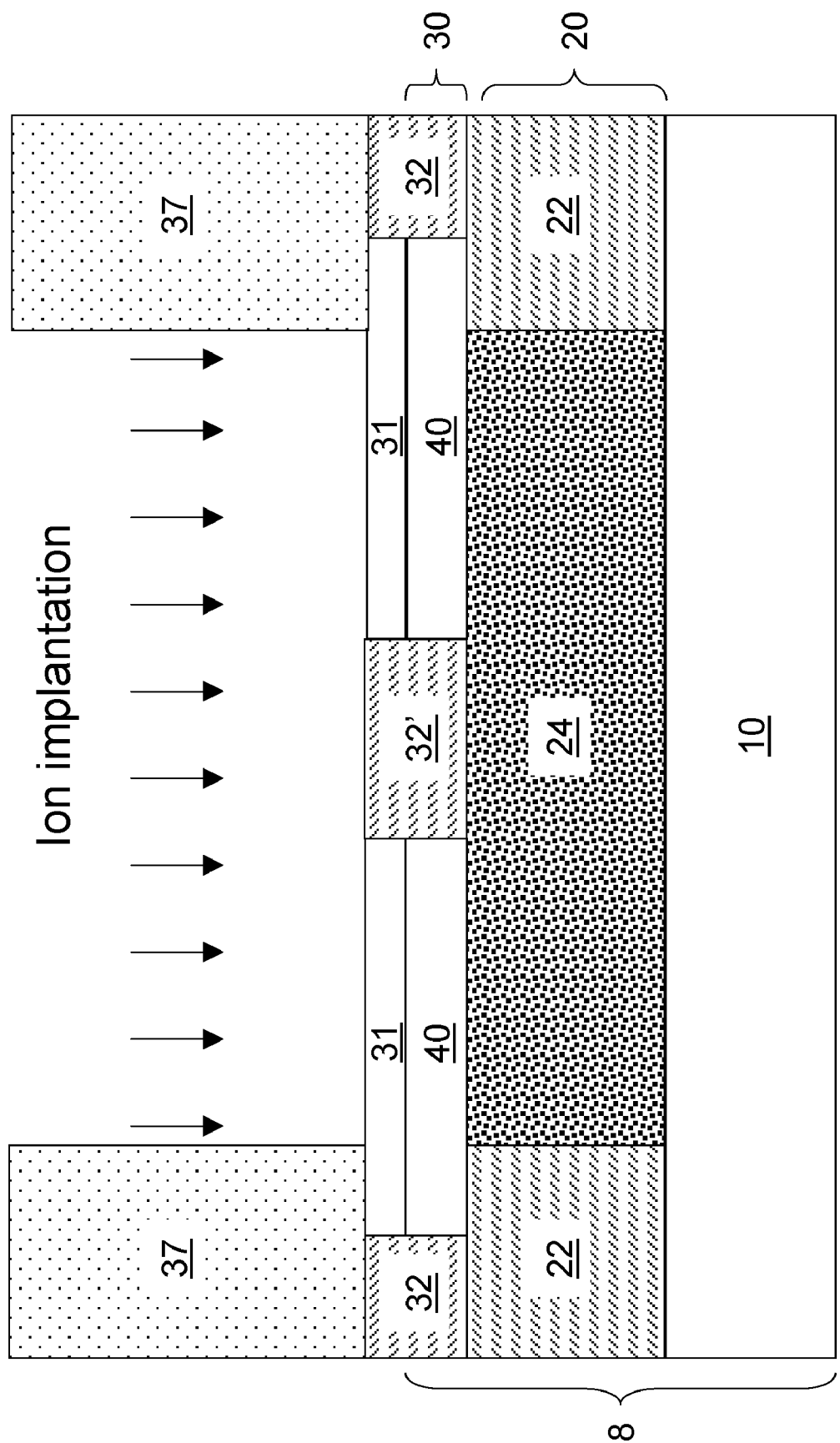

Referring to FIG. 4, accelerated ions are implanted into the portion of the contiguous buried insulator portion 22C located underneath the opening in the masking layer 37 employing the masking layer 37 as an implantation mask. The implanted portion of the contiguous buried insulator portion 22C becomes a damaged oxide portion 24 having a different composition than the contiguous buried insulator portion 22C, while the remaining portion of the contiguous buried insulator portion 22C constitutes a buried insulator portion 22 having the same composition as the contiguous buried insulator portion 22C, i.e., comprising silicon oxide. The sidewalls of the damaged oxide portion 24 are substantially vertically coincident with sidewalls of the masking layer 37.

The implanted ions may be any ion that may structurally damage the material of the contiguous buried insulator portion 22C or alter the chemical composition of the material of the contiguous buried insulator portion 22C so that the damaged oxide portion 24 etches faster than the buried insulator portion 22 when exposed to an etchant. In other words, the enhancement in the etch rate of the damaged oxide portion 24 may be effected by structural change in the damaged oxide portion 24 compared to the contiguous buried insulator portion 22C, compositional change in the damaged oxide portion 24, or a combination thereof so that the damaged oxide portion 24 etches faster than the buried insulator portion 22 which has the same structure and composition as the contiguous buried insulator portion 22C.

The implanted ions may comprise germanium, silicon, carbon, boron, gallium, indium, phosphorus, arsenic, antimony, nitrogen, oxygen, fluorine, hydrogen, helium, neon, argon, krypton, xenon, radon, and a combination thereof. Any other ion or ionized molecule that may structurally damage, and/or change the chemical reactivity of, the contiguous buried insulator portion 22C to enhance an etch rate of the damaged oxide portion 24 over the etch rate of the buried insulator portion 22 under the same etch chemistry may be employed for the purposes of the present invention. In one example, germanium ions are implanted to form the damaged oxide portion, in which the atomic concentration of germanium is from about 1% to about 40%, which renders the damaged oxide portion 24 less etch resistant to hydrogen peroxide containing etch chemistry than the buried insulator portion 22.

Figure 5:
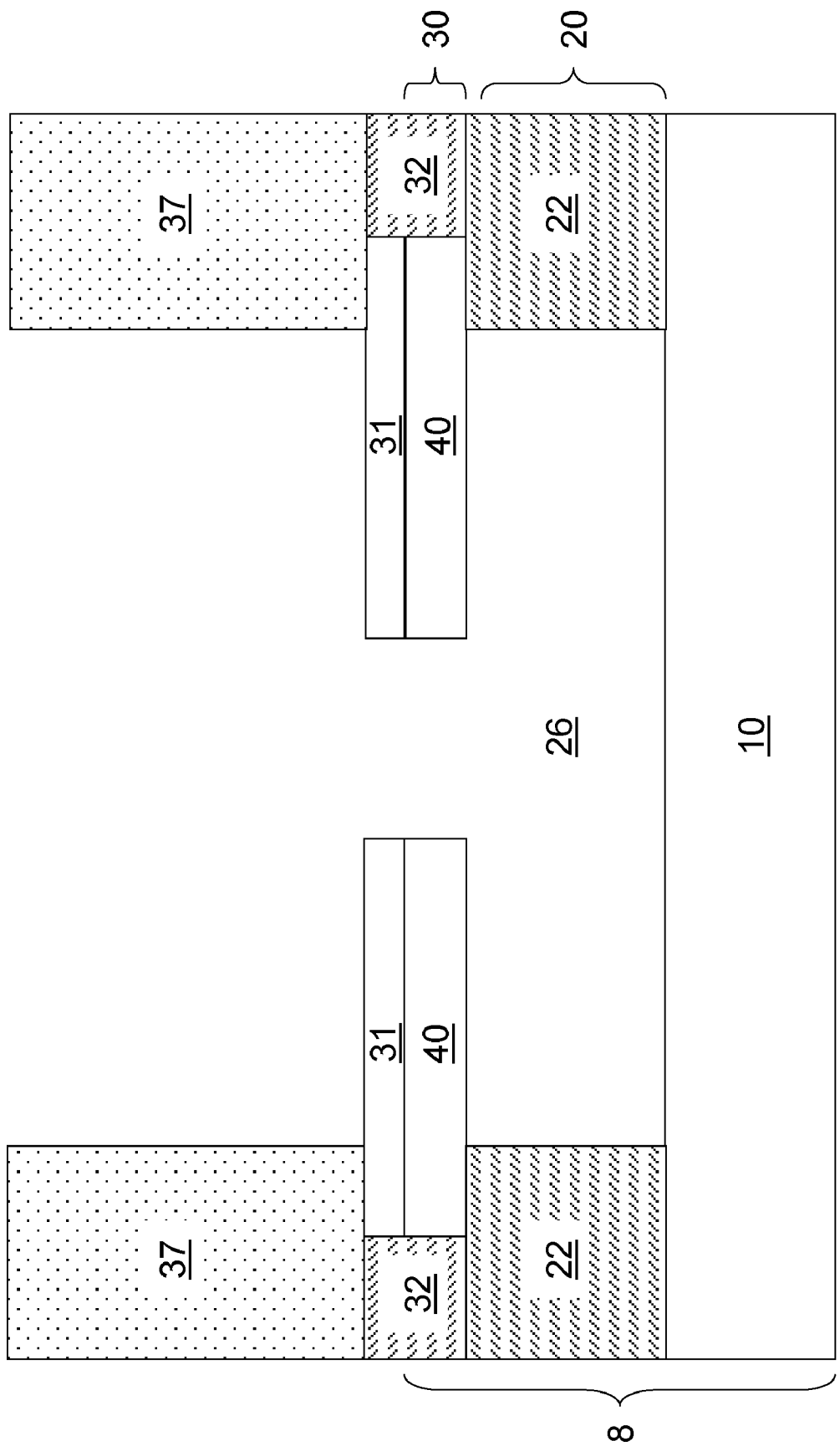

Referring to FIG. 5, the second shallow trench isolation portion 32' is removed by an etch, which may be a wet etch or a dry etch. For example, the second shallow trench isolation portion 32' may comprise silicon oxide, the masking layer 37 may comprise a photoresist, the top surface of the at least one pad layer 31 may comprise silicon nitride, and the etching of the second shallow trench isolation portion 32' may be effected by a wet etch employing hydrofluoric acid (HF) which etches the second shallow trench isolation portion 32' selective to the photoresist, the top semiconductor portions 40, and the at least one pad layer 31.

The same etch chemistry may be employed to etch a majority portion of the damaged oxide portion 24, in which the majority portion includes the portion of the damaged oxide portion radially extending from the interface of the damaged oxide portion 24 and the second shallow trench isolation portion 32'. Before the sidewalls of the buried insulator portion 22 is reached by an expanding cavity within the damaged oxide portion 24, another etch chemistry that etches the damaged oxide portion 24 selective to the buried insulator portion 22 may be employed so that the outer boundary of a cavity 26 is self aligned to the outer sidewalls of the damaged oxide portion, i.e., the cavity 26 is self-aligned to the sidewalls of the buried insulator portion 22. For example, the implanted ions may comprise germanium and the etch chemistry may employ hydrogen peroxide, which etches a germanium-containing silicon oxide present in the damaged oxide portion 24 selective to silicon oxide that does not contain germanium and is present in the buried insulator portion 22. Alternately, if an etch chemistry providing selective etching of the damaged oxide portion 24 over the buried insulator portion 22 provides sufficiently high etch rate for the damaged oxide portion 24, such an etch chemistry may be employed to etch the entirety of the damaged oxide portion 24. The sidewalls of the cavity 26 are substantially vertically coincident with sidewalls of the masking layer 37. The masking layer 37 is subsequently removed selective to the exposed material within the cavity 26 and the material of the top surface of the at least one pad layer 31.

Figure 6:
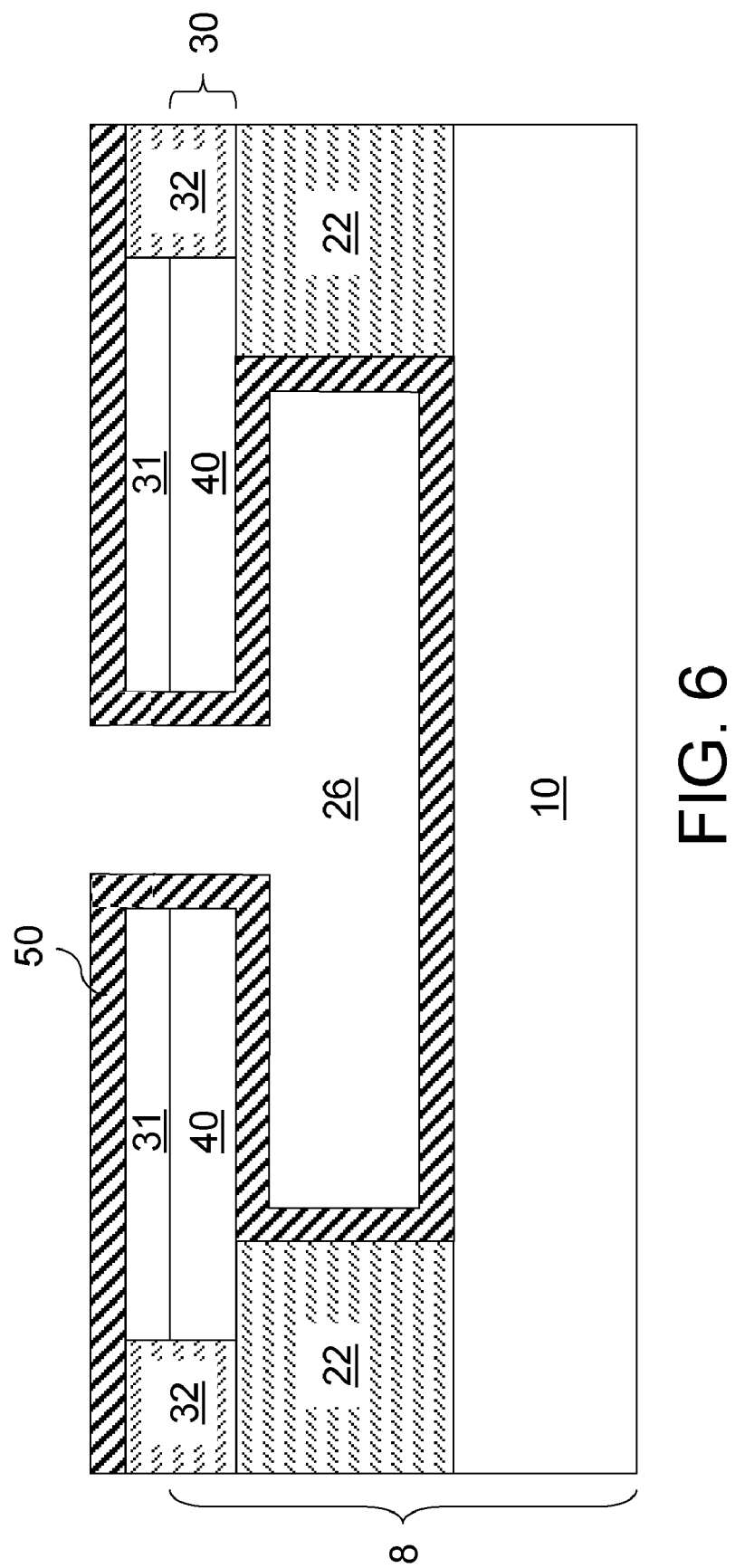

Referring to FIG. 6, a dielectric layer 50 is formed on exposed surfaces of the first exemplary semiconductor structure. The dielectric layer 50 may comprise a high-k (high dielectric constant) dielectric material known in the art such as $HfO_2$, $ZrO_2$, $Al_2O_3$, $TiO_2$, $La_2O_3$, $SrTiO_3$, $LaAlO_3$, $Y_2O_3$, mixtures thereof, and silicates thereof. The high-k dielectric material may be deposited by methods known in the art such as atomic layer deposition (ALD) or chemical vapor deposition (CVD). Alternatively, the dielectric layer 50 may comprise a silicon containing dielectric material may be deposited by chemical vapor deposition such as low pressure chemical vapor deposition (LPCVD) and optionally, in combination with, thermal oxidation and/or thermal nitridation. The dielectric layer 50 is formed on all exposed surfaces. The dielectric layer 50 is sufficiently thick to provide insulator integrity between the top semiconductor portions 40 and a back gate electrode to be subsequently formed in the cavity 26. At the same time, the dielectric layer 50 is sufficiently thin to allow electrical control of the body potential within the top semiconductor portions 40 by an independently biased back gate to be subsequently formed within the cavity 26. The thickness of the dielectric layer 50 may be from about 1.0 nm to about 15 nm, and typically from about 1.5 nm to about 6 nm.

Figure 6A:
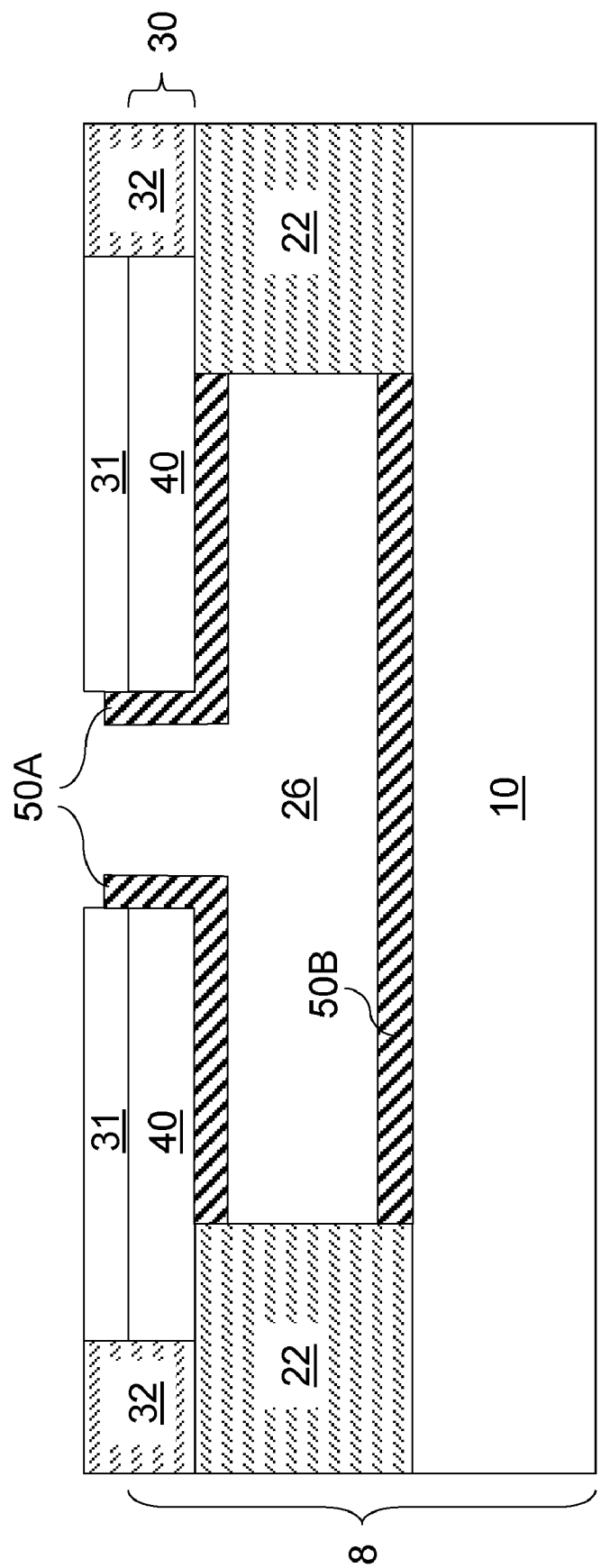
FIGS. 6A and 6B show a first variation and a second variation of the first exemplary semiconductor structure at a processing step corresponding to FIG. 6 according to the present invention.

Referring to FIG. 6A, a first variation of the first exemplary semiconductor structure is shown, in which dielectric layers are formed on exposed surfaces of semiconductor materials by thermal oxidation and/or thermal nitridation. Specifically, a first dielectric layer 50A comprising a dielectric semiconductor oxide and/or a dielectric semiconductor nitride is formed on sidewall surfaces and exposed bottom surface portions of the top semiconductor portions 40. Further, the handle substrate 10 also comprises a semiconductor material that forms another semiconductor oxide and/or a semiconductor nitride. Thus, a second dielectric layer 50B is formed on an exposed top surface of the handle substrate 10. The first and second dielectric layers (50A, 50B) may comprise the same material, or may comprise different materials.

Figure 6B:
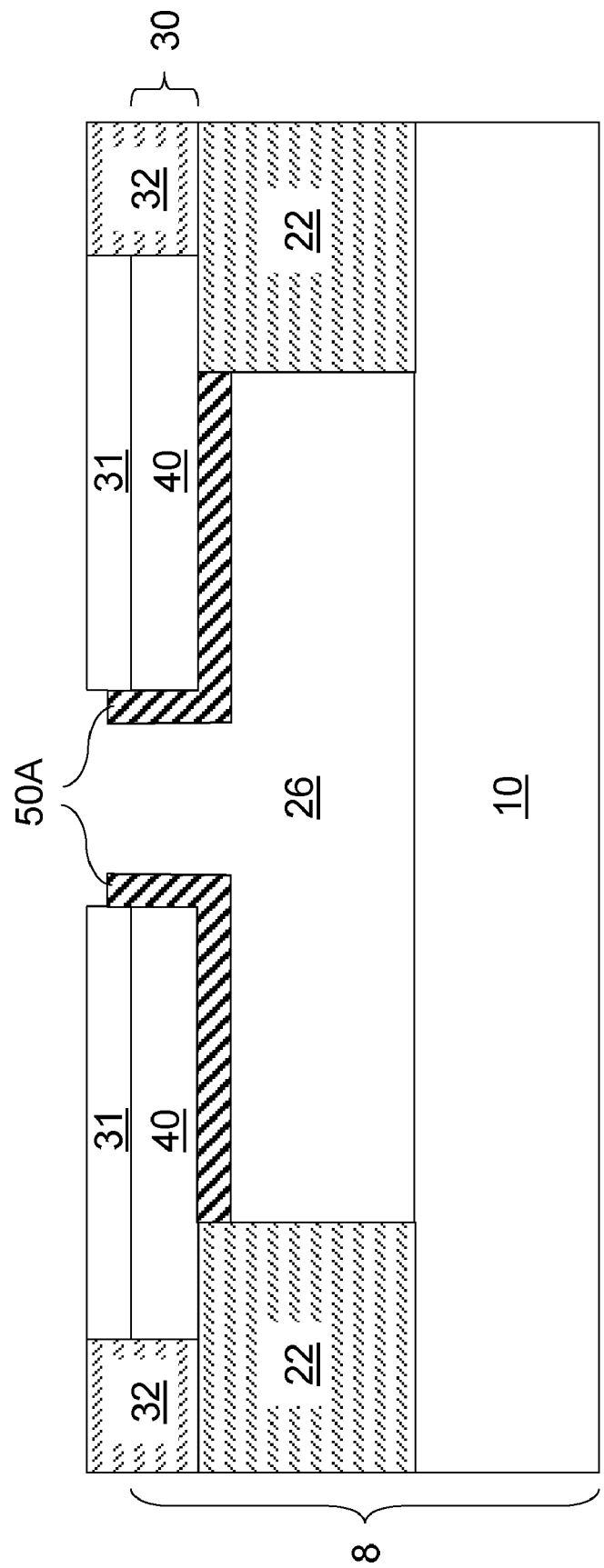

Referring to FIG. 6B, a second variation of the first exemplary semiconductor structure is shown, in which a first dielectric layer 50A comprising a dielectric semiconductor oxide and/or a dielectric semiconductor nitride is formed on sidewall surfaces and exposed bottom surface portions of the top semiconductor portions 40. In this case, however, the handle substrate comprises an insulating material. A separate thermal oxide layer or a thermal nitride layer is not formed on the exposed top surface of the handle substrate 10.

Figure 7:
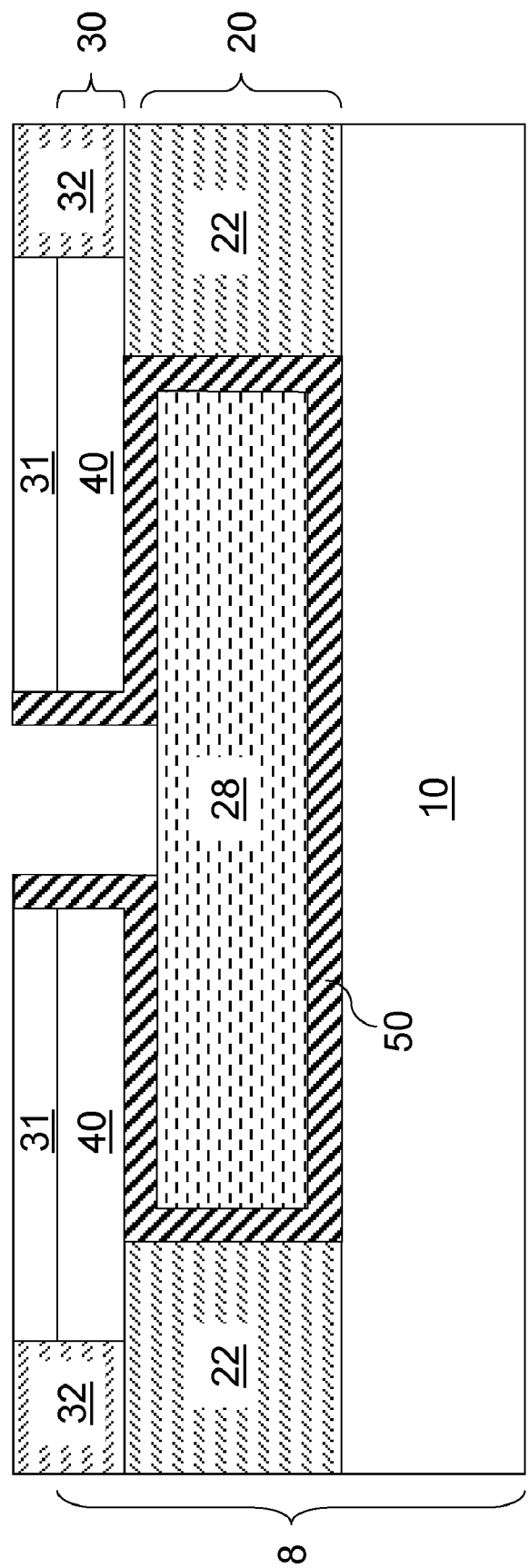

Referring to FIG. 7, a back gate electrode 28 is formed within the cavity 26 by deposition of a conductive material within the cavity 26, followed by a recess etch that removes the a portion of the conductive material within a narrow opening portion of the cavity 26, which is surrounded by the stack of the top semiconductor portions 40 and the at least one pad layer 32. The conductive material may be, but is not limited to, a doped semiconductor material (e.g., polycrystalline or amorphous silicon, germanium, and a silicon germanium alloy), a metal (e.g., tungsten, titanium, tantalum, ruthenium, cobalt, copper, aluminum, lead, platinum, tin, silver, and gold), a conducting metallic compound material (e.g., tantalum nitride, titanium nitride, tungsten silicide, tungsten nitride, titanium nitride, tantalum nitride, ruthenium oxide, cobalt silicide, and nickel silicide), or any suitable combination of these materials. For example, the conductive material may comprise doped polysilicon having a dopant concentration from about $1.0 \times 10^{19}/cm^3$ to about $3.0 \times 10^{21}/cm^3$, and typically from about $1.0 \times 10^{20}/cm^3$ to about $5.0 \times 10^{20}/cm^3$, although lesser and greater dopant concentrations are also explicitly contemplated herein. The doped polysilicon may have a doping of p-type or n-type. Alternately, the conductive material may comprise a material typically employed in a metal gate layer such as TaN, TiN, WN, etc. While conformal deposition of the conductive material is preferred so that no cavity is formed inside the back gate electrode 28, embodiments in which lack of conformity in a deposition process induces formation of a cavity within the back gate electrode 28 is also contemplated herein.

Figure 8:
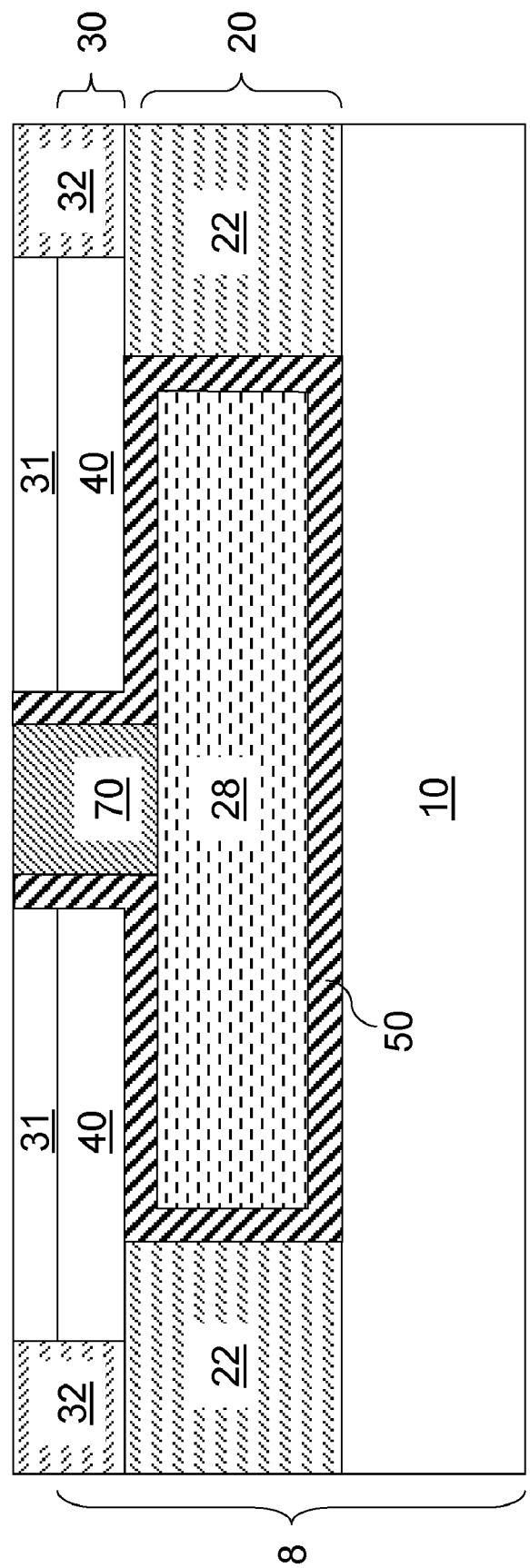

Referring to FIG. 8, a dielectric material plug 70 is formed by depositing a dielectric material within the recessed portion, i.e., the narrow opening portion, directly above the back gate electrode and planarizing the dielectric material employing the at least one pad layer 31 as a stopping layer. Thus, a top surface of the dielectric material plug 70 is substantially coplanar with the top surface of the at least one pad layer 31. The dielectric material plug 70 comprises a silicon oxide containing material such as undoped silicate glass (USG), borosilicate glass (BSG), phosphosilicate glass (PSG), fluorosilicate glass (FSG), borophosphosilicate glass (BPSG), spin-on-glass, or a combination there of, and may optionally have a dielectric liner.

Figure 9:
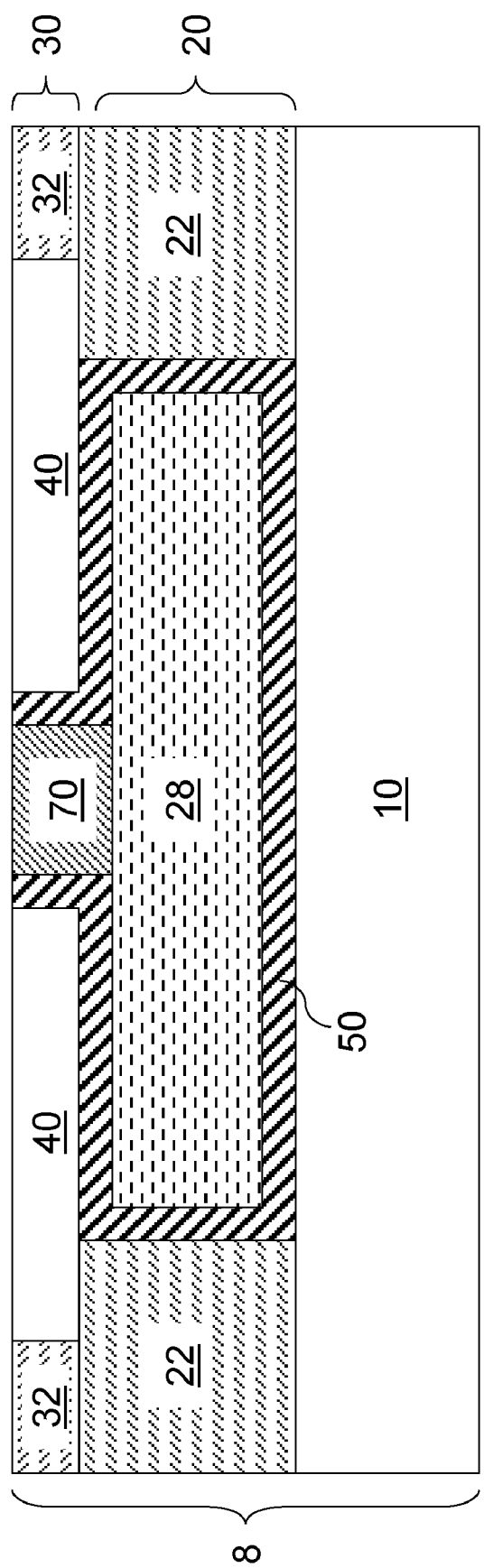

Referring to FIG. 9, the first shallow trench isolation portions 32 and upper regions of the dielectric material plug 70 are recessed to a depth so that the upper surfaces of the first shallow trench isolation portions 32 and the dielectric material plug 70 are substantially coplanar with the top surfaces of the top semiconductor portions 40. In case the first shallow trench isolation portions 32 and the dielectric material plug comprise a silicon oxide containing material and the top surface of the at least one pad layer 31 comprise silicon nitride, a reactive ion etch or a wet etch, such as a hydrofluoric acid (HF) based etch, that removes silicon oxide selective to silicon nitride may be employed.

The at least one pad layer 31 is thereafter removed selective to the top semiconductor portions 40, the first shallow trench isolation portions 32, and the dielectric material plug 70. Portions of the dielectric layer 50 that protrudes above the top surface of the top semiconductor portions 40 may also be removed during the removal of the at least one pad layer 31 or in a separate processing step. For example, if the at least one pad layer 31 comprises silicon nitride and/or silicon oxide and the dielectric layer 50 comprises silicon nitride or silicon oxide, the protruding portion of the dielectric layer 50 may be removed during the removal of the portion of the at least one pad layer 50 that comprise the same material. At the end of removal of the at least one pad layer 31 and the protruding portion of the dielectric layer 50, the top surfaces of the top semiconductor portion 40, the first shallow trench isolation portions 32, the dielectric material plug 70, and the dielectric layer 50 are substantially coplanar among one another.

Figure 10:
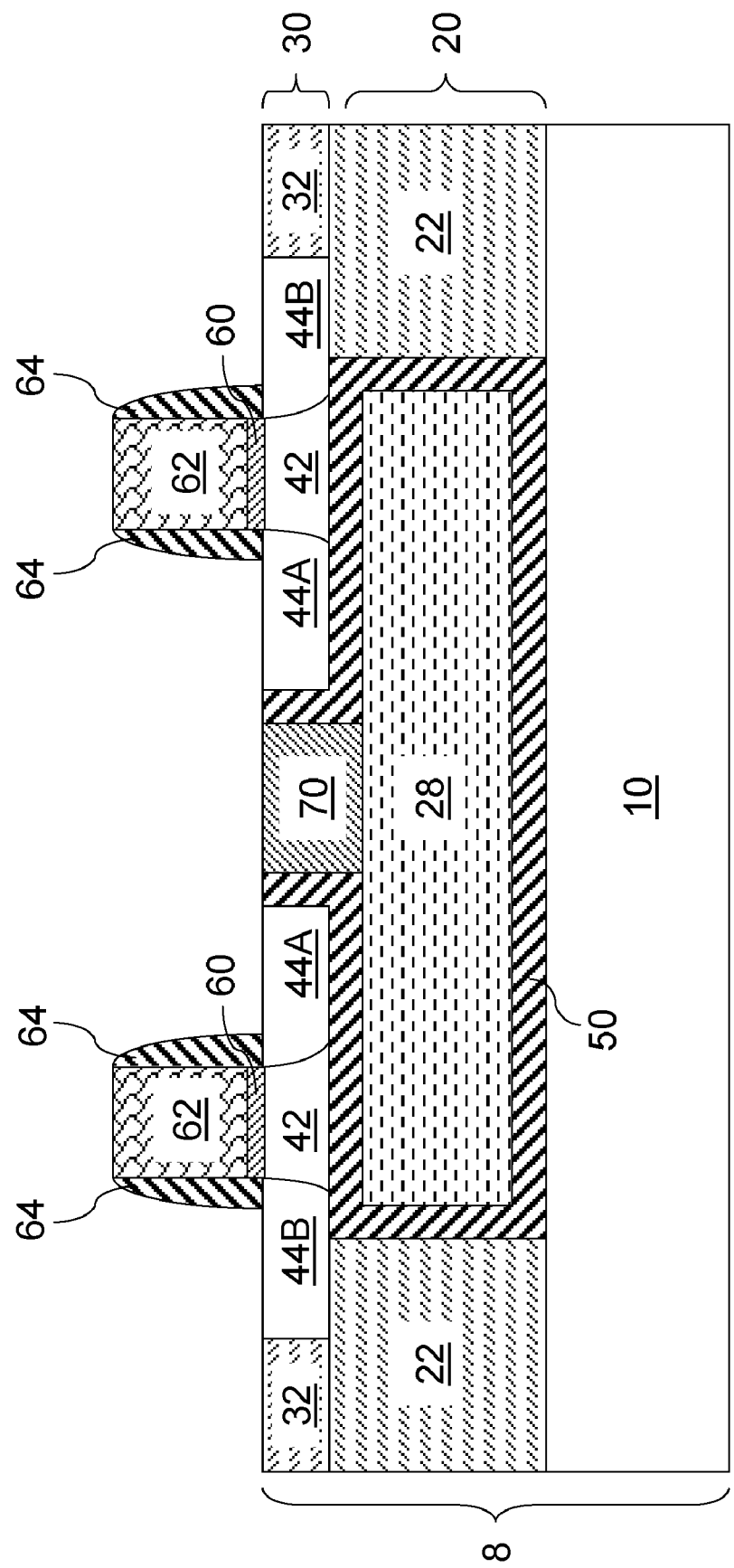

Referring to FIG. 10, gate dielectrics 60, gate electrodes 62, and dielectric gate spacers 64 are formed over the top surface of the top semiconductor portions as known in the art. Dopants are implanted into the top semiconductor portions employing implantation masks to form first source/drain regions 44A and second source/drain regions 44B. A "source/drain region" is a region that may be employed either as a source region or as a drain region depending on the design of the semiconductor device. Each first source/drain region 44A is one of a source region and a drain region. Each second source/drain region 44B is the other of the source region and the drain region. In one embodiment, each of the first source/drain regions 44A is a source region, each of the second source/drain regions 44B is a drain region. In another embodiment, each of the first source/drain regions 44A is a drain region, each of the second source/drain regions 44B is a source region. Alternately, the functionality of the first source/drain regions 44A and the second source/drain regions 44B may be mixed, i.e., a first source/drain region 44A may be a source region for one device, and another source/drain region 44A may be a drain region for another device, etc. The regions of the top semiconductor portions 40 that are not implanted by the dopants constitute body regions 42, which may have a doping of the opposite conductivity type than an adjoining source region (44A or 44B) and an adjoining drain region (44B or 44A) at a doping concentration that is typically lower than the doping concentration of the adjoining source region (44A or 44B) and the adjoining drain region (44B or 44A). Metal semiconductor alloy regions (not shown) comprising a metal semiconductor alloy such as a metal silicide may be formed as needed on exposed semiconductor surfaces employing methods well known in the art.

The first source/drain region 44A and the body region 42 overlie the back gate electrode 28 in each field effect transistor. Further, a portion of the second source/drain region 44B may also overlie the back gate electrode 28. Two field effect transistors may be formed as a pair sharing the same back gate electrode 28, or alternately, a back gate electrode 28 may be dedicated to one field effect transistor. The first source/drain region 44A may be the source region or the drain region of a field effect transistor. Thus, it is possible to bias either the source region or the drain region of a field effect transistor.

Figure 11:
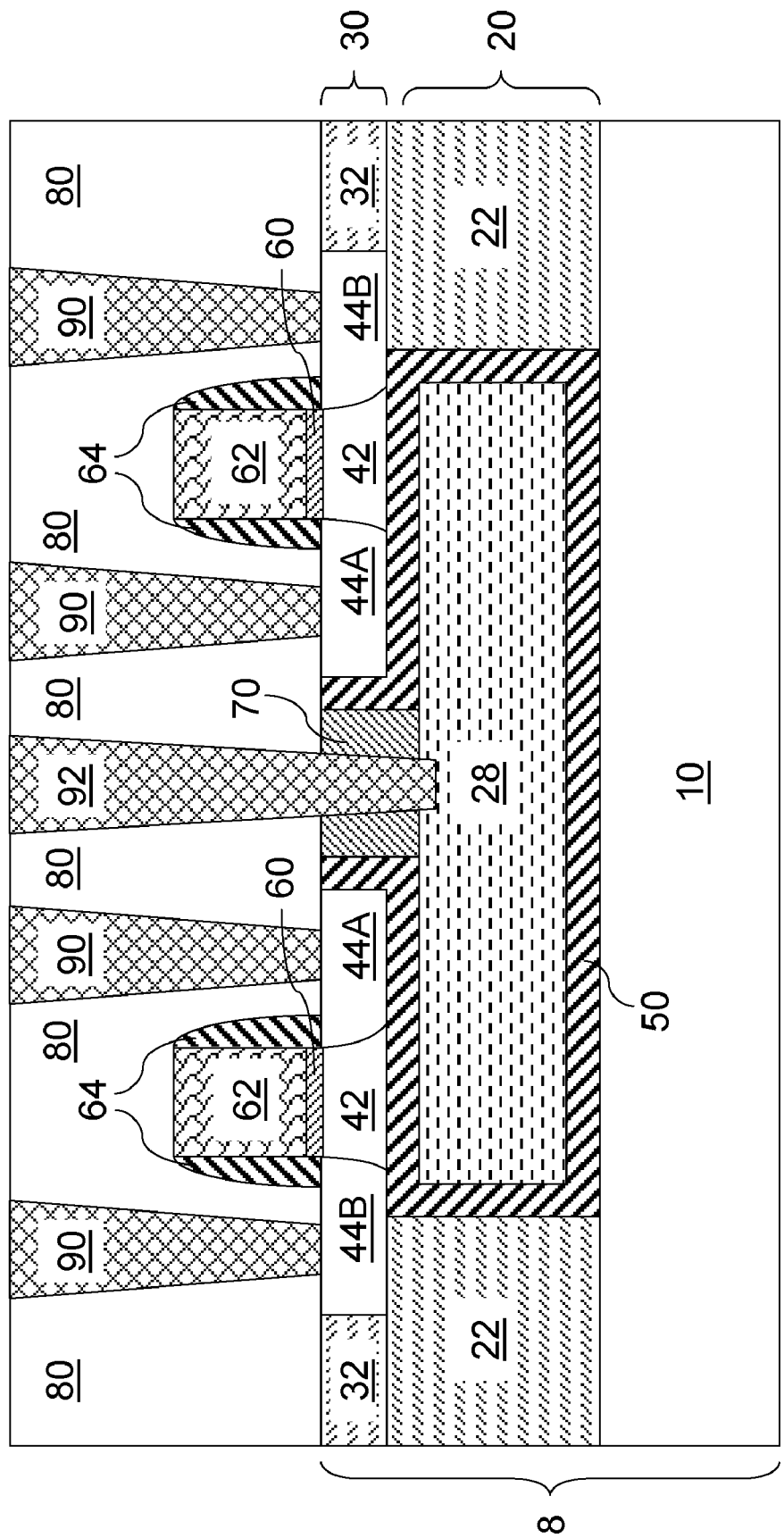

Referring to FIG. 11, a middle-of-line dielectric layer 80 is formed over the SOI substrate 8. The MOL dielectric layer 80 may include a mobile ion diffusion barrier layer (not shown) that prevents diffusion of mobile ions such as $Na^+$ and $K^+$ from back-end-of-line (BEOL) dielectric layers into the components of the field effect transistor, i.e., the source and drain regions (44A, 44B), and the gate electrodes 62. The MOL dielectric layer 80 may comprise, for example, a CVD oxide and/or a spin-on-glass. The CVD oxide may be an undoped silicate glass (USG), borosilicate glass (BSG), phosphosilicate glass (PSG), fluorosilicate glass (FSG), borophosphosilicate glass (BPSG), or a combination thereof. The thickness of the MOL dielectric layer 80 may be from about 200 nm to about 500 nm. The MOL dielectric layer 80 is preferably planarized, for example, by chemical mechanical polishing (CMP).

Various contact via holes are formed in the MOL dielectric layer 80 and filled with a conductive material to from various contact vias including source and drain contact vias 90 and a conductive contact via 92 contacting the back gate electrode 28 through the dielectric material cap 70. The conductive material may comprise a metal (e.g., copper, aluminum, titanium, tungsten, etc.), a conductive metallic compound material (e.g., titanium nitride, tantalum nitride, etc.), a doped semiconductor (e.g., doped polysilicon), or a combination thereof. The dielectric material plug 70 surrounds the conductive contact via 92, which extends through the dielectric material plug 70. Thus, the dielectric material plug has a hole 70 therein, and the conductive contact via 92 extends below a depth of a bottom surface of the dielectric material plug 70.

Figure 11A:
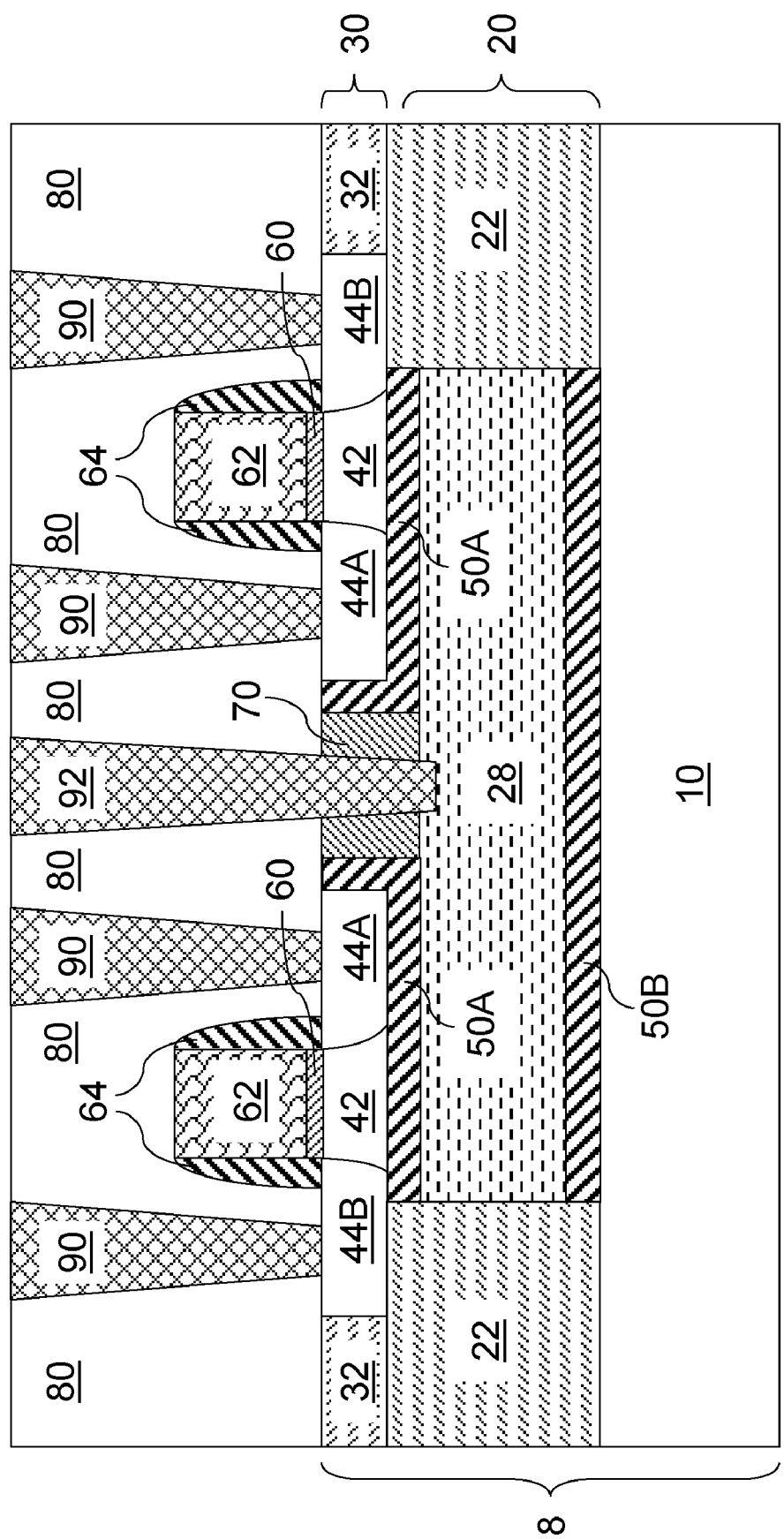
FIGS. 11A and 11B show the first variation and the second variation of the first exemplary semiconductor structure at a processing step corresponding to FIG. 11 according to the present invention.

Referring to FIG. 11A, the first variation of the first exemplary semiconductor structure is shown at a processing step corresponding to FIG. 11. The first dielectric layer 50A abuts sidewalls of the first source/drain regions 44A, the bottom surfaces of the first source/drain regions 44A, the bottom surfaces of the body regions 42, and portions of the bottom surfaces of the second source/drain regions 44B. The buried insulator portion 22 laterally abuts the back gate electrode 28. A second dielectric layer 50B vertically abuts the handle substrate 10 and the back gate electrode 28.

Figure 11B:
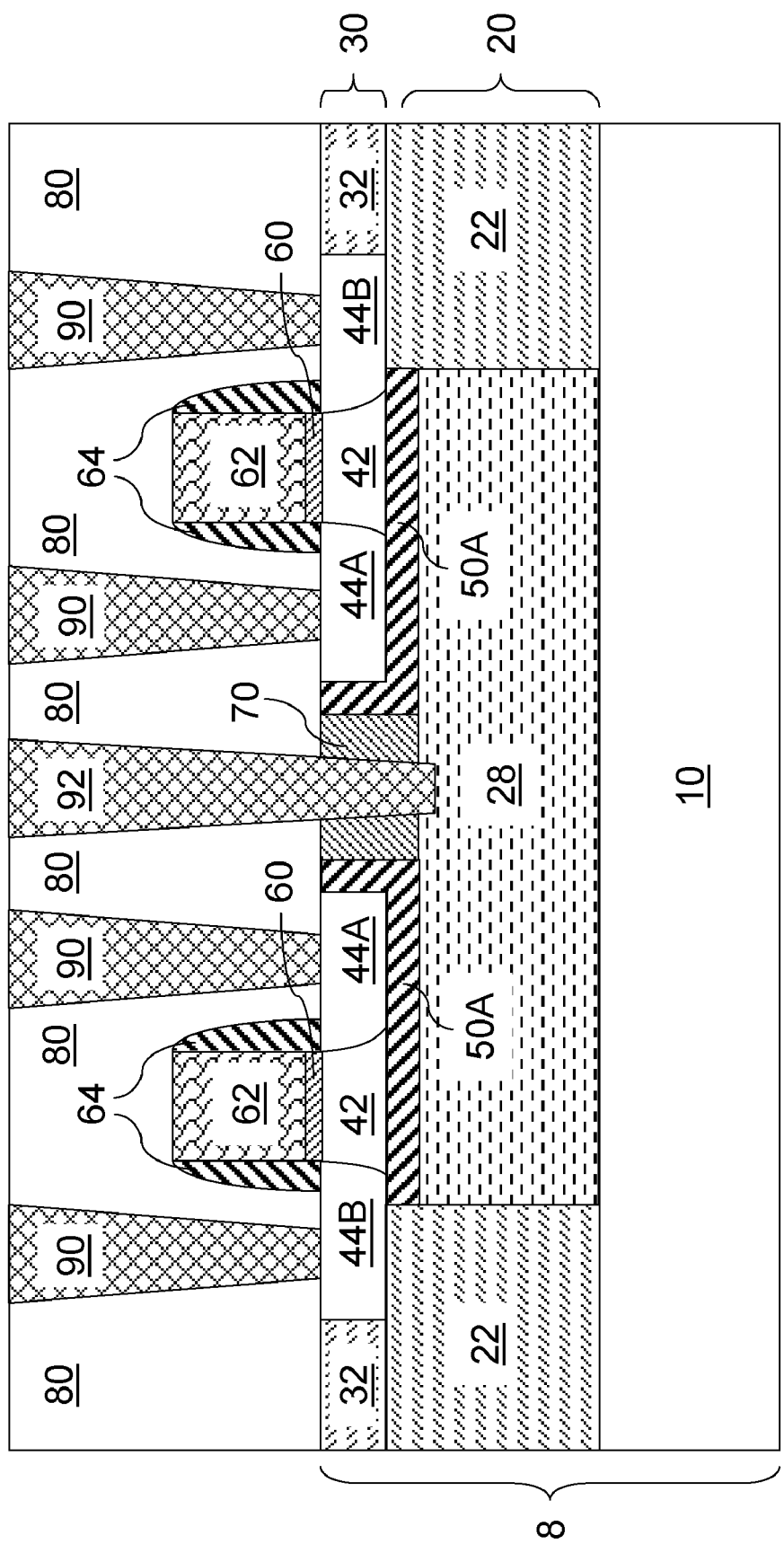

Referring to FIG. 11B, the second variation of the first exemplary semiconductor structure is shown at a processing step corresponding to FIG. 11. The first dielectric layer 50A abuts sidewalls of the first source/drain regions 44A, the bottom surfaces of the first source/drain regions 44A, the bottom surfaces of the body regions 42, and portions of the bottom surfaces of the second source/drain regions 44B. The buried insulator portion 22 laterally abuts the back gate electrode 28. The handle substrate 10 vertically abuts the back gate electrode 28 since a second dielectric layer of the first variation of the first exemplary semiconductor structure is not present in the second variation.

Figure 12:
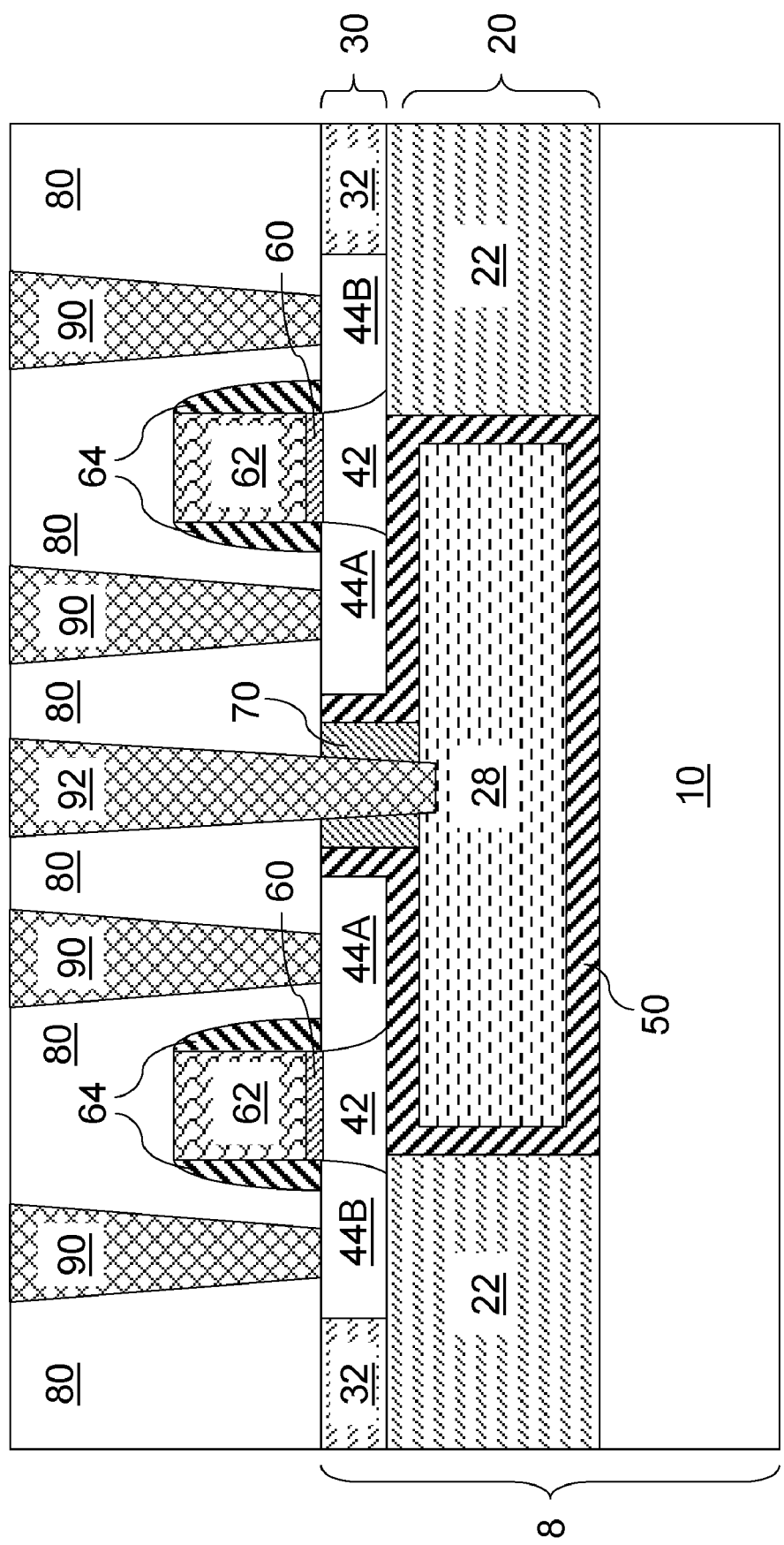
FIG. 12 shows a third variation on the first exemplary semiconductor structure according to the present invention.

Referring to FIG. 12, a third variation of the first exemplary semiconductor structure is shown, in which the first source/drain regions 44A and portions of the body regions 42 overlie the back gate electrode 28. However, the second source/drain regions 44B do not overlie the back gate electrode 28. Thus, the effect of the bias applied by the back gate electrode 28 on the second source/drain regions 44B is reduced compared to the structure of FIG. 11. Therefore, parasitic capacitance of second source/drain regions 44B is reduced.

Figure 13:
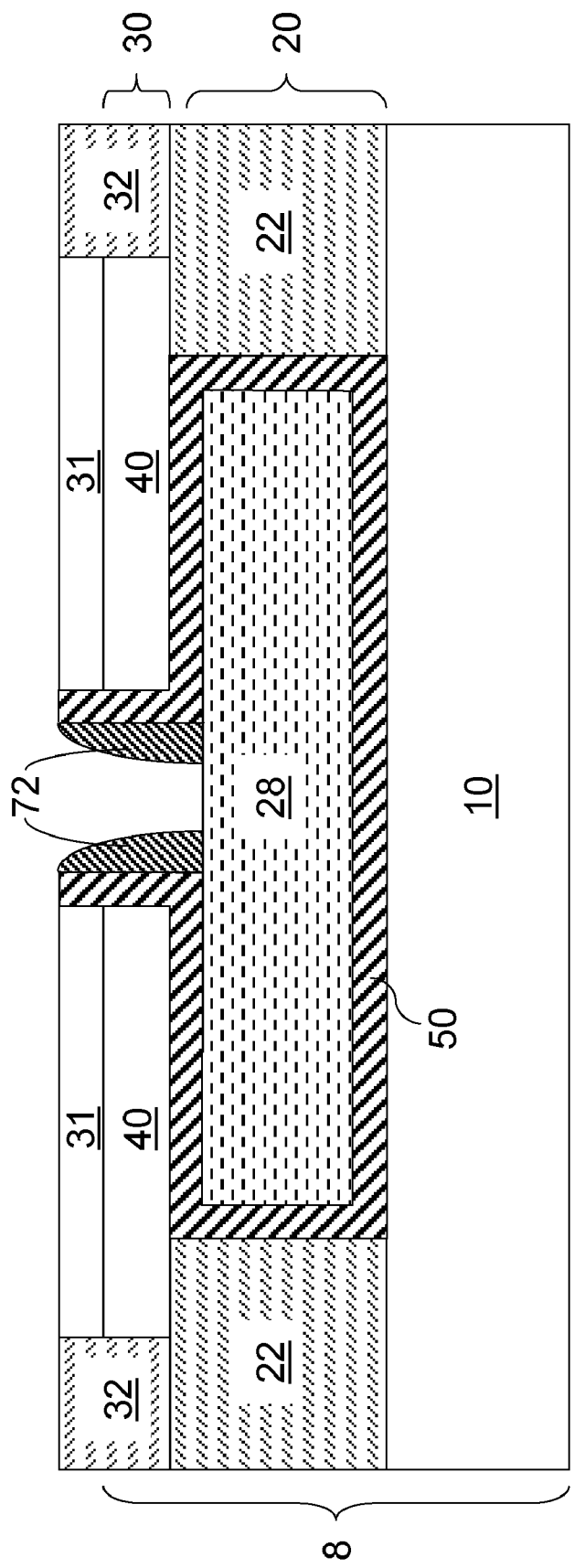
FIGS. 13-15 show sequential vertical cross-sectional views of a second exemplary semiconductor structure according to the present invention.

Referring to FIG. 13, a second exemplary semiconductor structure according to a second embodiment of the present invention is derived from the first exemplary semiconductor structure of FIG. 7 by forming a dielectric spacer 72 directly on inner sidewalls of the portion of the dielectric layer 50 above a top surface of the back gate electrode 28. The dielectric spacer 72 is formed by a conformal deposition of a dielectric material such as silicon oxide or silicon nitride, followed by an anisotropic ion etch. Preferably, the width of the dielectric spacer 72 is at least equal to an overlay tolerance of the lithography process employed to pattern contact holes in the MOL dielectric layer 80 to be subsequently deposited. The width of the dielectric spacer 72, as measured near the bottom of the dielectric spacer 72, is from about 10 nm to about 100 nm, and typically from about 15 nm to about 60 nm.

Figure 14:
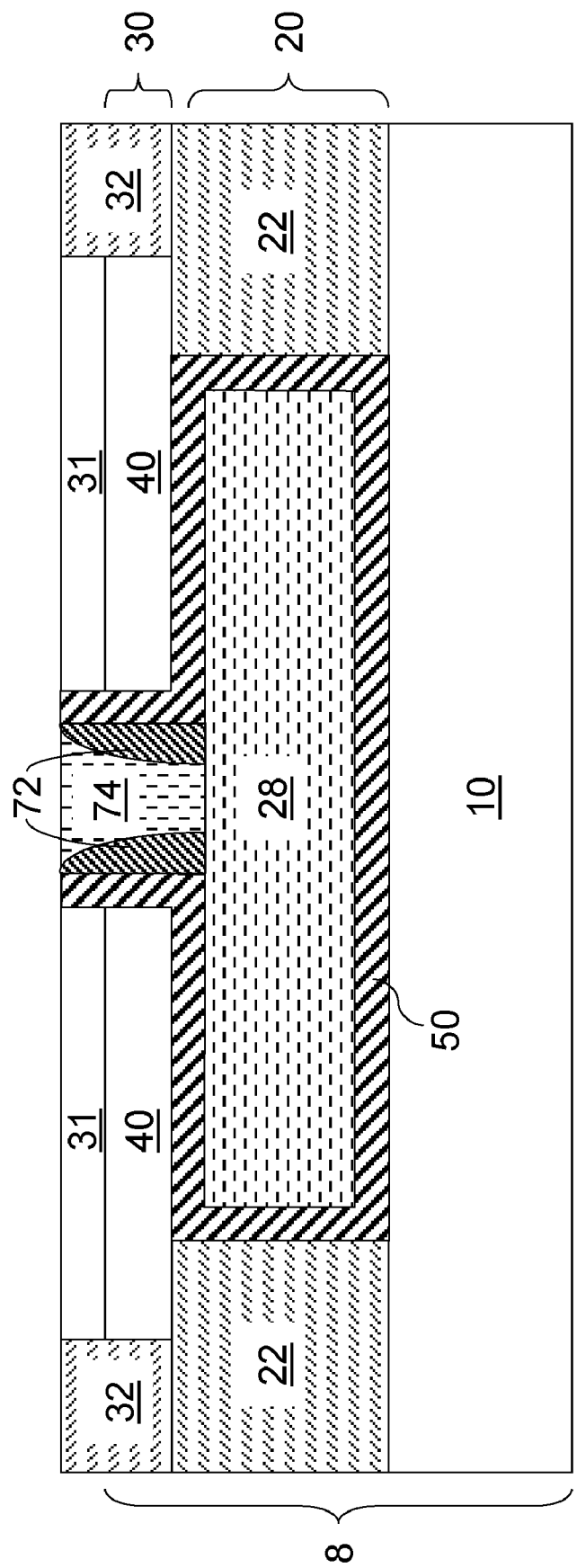

Referring to FIG. 14, a second conductive material is deposited within the space surrounded by the dielectric spacer 72 and planarized to form a conductive material plug 74. The conductive material plug 74 may comprise any of the conductive materials that may be employed for the back gate electrode 28 as described above. For example, the conductive material plug 74 may comprise a doped semiconductor material having a doping of p-type or n-type. The at least one pad layer 31 may be employed as a stopping layer during the planarization process so that a top surface of the conductive material plug 74 is substantially coplanar with the top surface of the at least one pad layer 31.

Processing steps corresponding to FIG. 9 of the first embodiment are subsequently performed. The difference between the first embodiment and the second embodiment is that the portions of the conductive dielectric plug 74 and the dielectric spacer 72 is recessed to a level substantially coplanar with the top surfaces of the top semiconductor portions 40 in the second embodiment in contrast to the recess of the dielectric material plug 70 in the first embodiment. Other processing steps of FIG. 9 including the recessing of the first shallow trench isolation portions 32 and protruding portions of the dielectric layer 50 and removal of the at least one pad layer 31 is performed thereafter.

Figure 15:
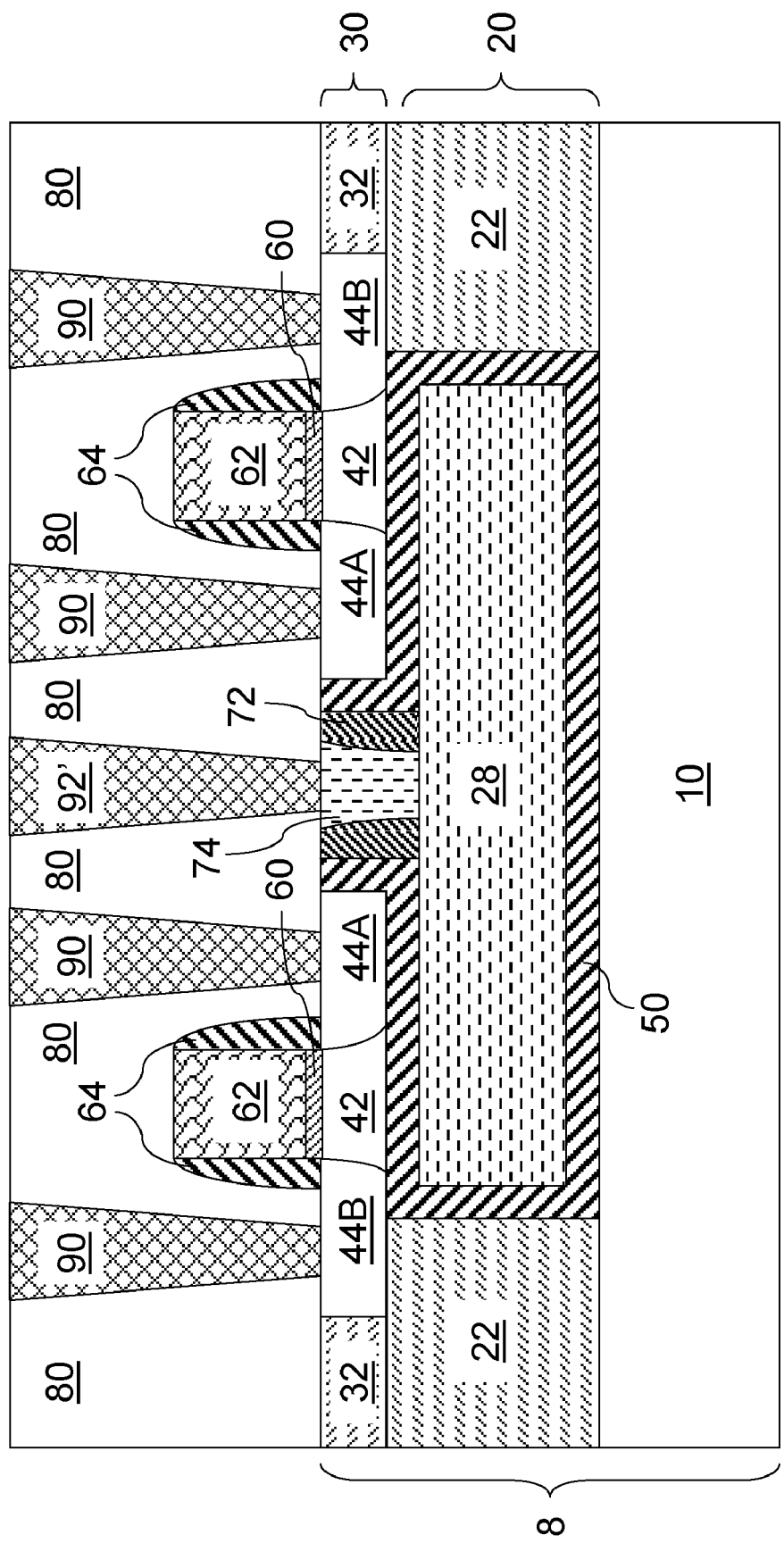

Processing steps corresponding to FIGS. 10-11 of the first embodiment are performed to form the second exemplary semiconductor structure shown in FIG. 15. In contrast to the first embodiment, however, a conductive contact via 92' does not directly contact the back gate electrode 28 but contacts the conductive dielectric plug 74. In other words, the conductive contact via 92' does not extend below the depth of source and drain contact vias 90, but the source and drain contact vias 90 and the conductive contact via 92' have substantially the same height. The process of forming the via holes for the source and drain contact vias 90 and the conductive contact via 92' is simplified since all via hole depths are substantially the same, in contrast with the first embodiment.

Figure 15A:
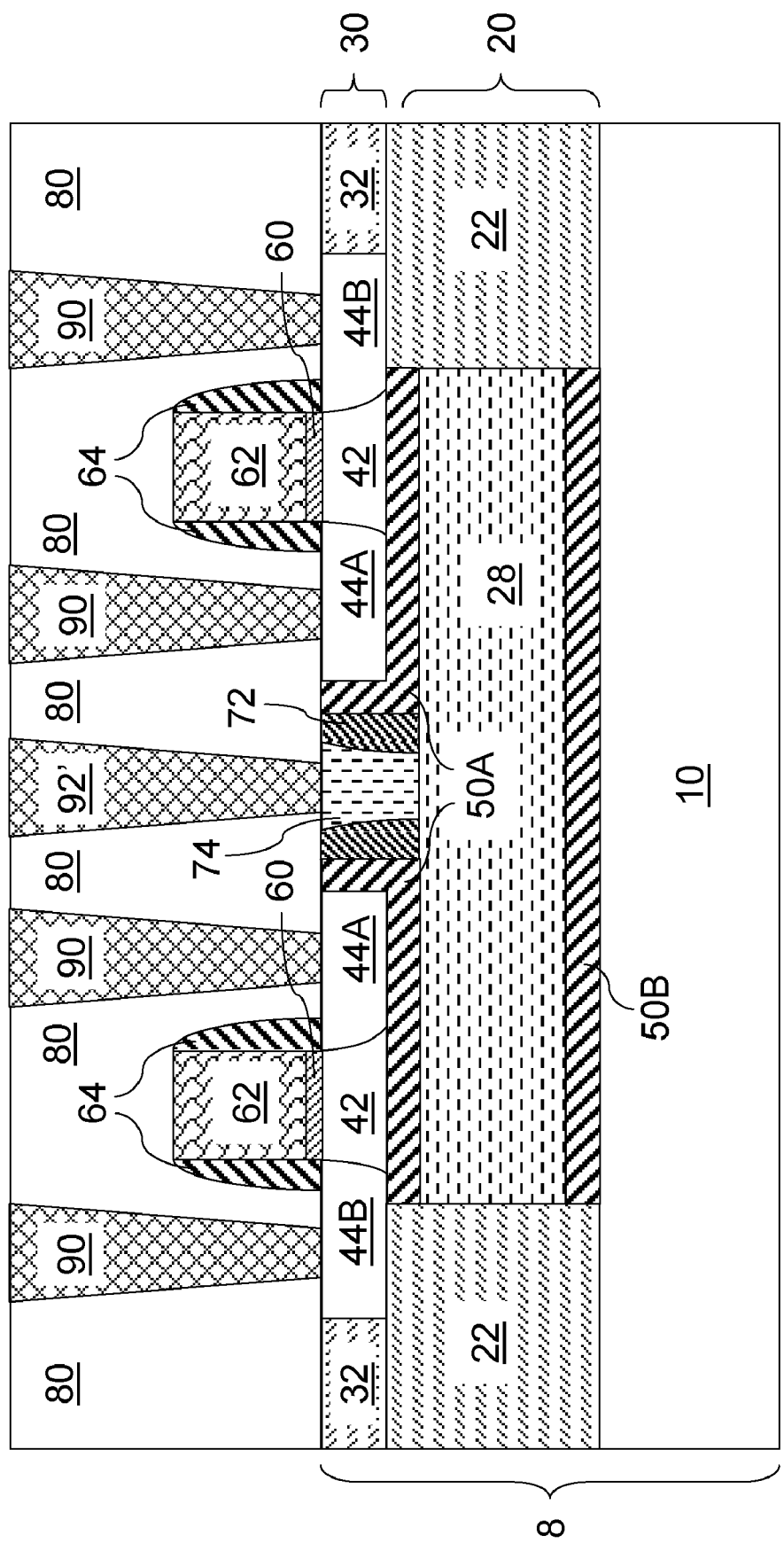
FIGS. 15A and 15B show a first variation and a second variation of the second exemplary semiconductor structure at a processing step corresponding to FIG. 15 according to the present invention.

Referring to FIG. 15A, a first variation of the second exemplary semiconductor structure is shown at a processing step corresponding to FIG. 15. The first dielectric layer 50A abuts sidewalls of the first source/drain regions 44A, the bottom surfaces of the first source/drain regions 44A, the bottom surfaces of the body regions 42, and portions of the bottom surfaces of the second source/drain regions 44B. The buried insulator portion 22 laterally abuts the back gate electrode 28. A second dielectric layer 50B vertically abuts the handle substrate 10 and the back gate electrode 28. The dielectric spacer 72 laterally abuts the first dielectric layer 50A.

Figure 15B:
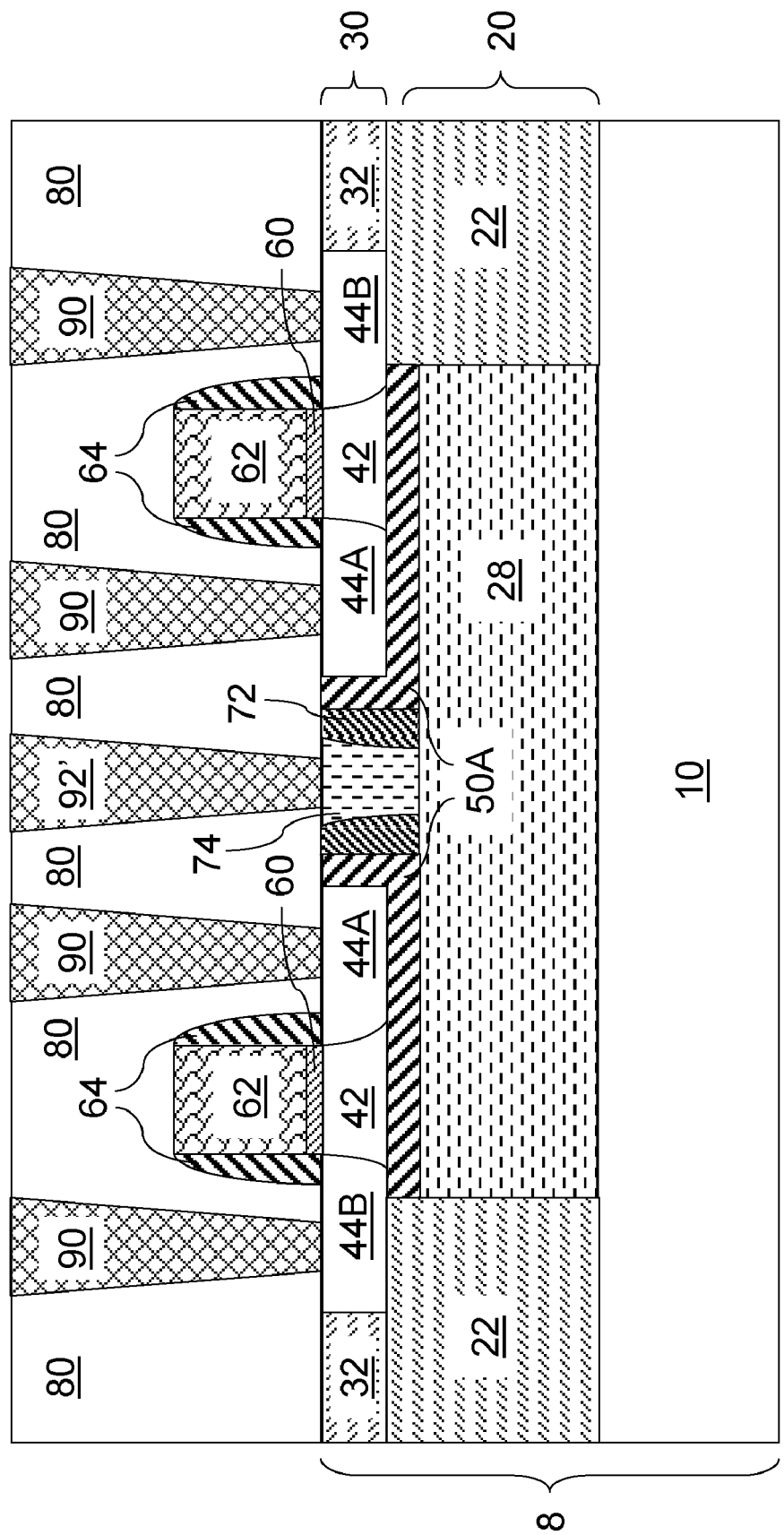

Referring to FIG. 15B, a second variation of the first exemplary semiconductor structure is shown at a processing step corresponding to FIG. 15. The first dielectric layer 50A abuts sidewalls of the first source/drain regions 44A, the bottom surfaces of the first source/drain regions 44A, the bottom surfaces of the body regions 42, and portions of the bottom surfaces of the second source/drain regions 44B. The buried insulator portion 22 laterally abuts the back gate electrode 28. The handle substrate 10 vertically abuts the back gate electrode 28 since a second dielectric layer of the first variation of the first exemplary semiconductor structure is not present in the second variation. The dielectric spacer 72 laterally abuts the first dielectric layer 50A.

Figure 16:
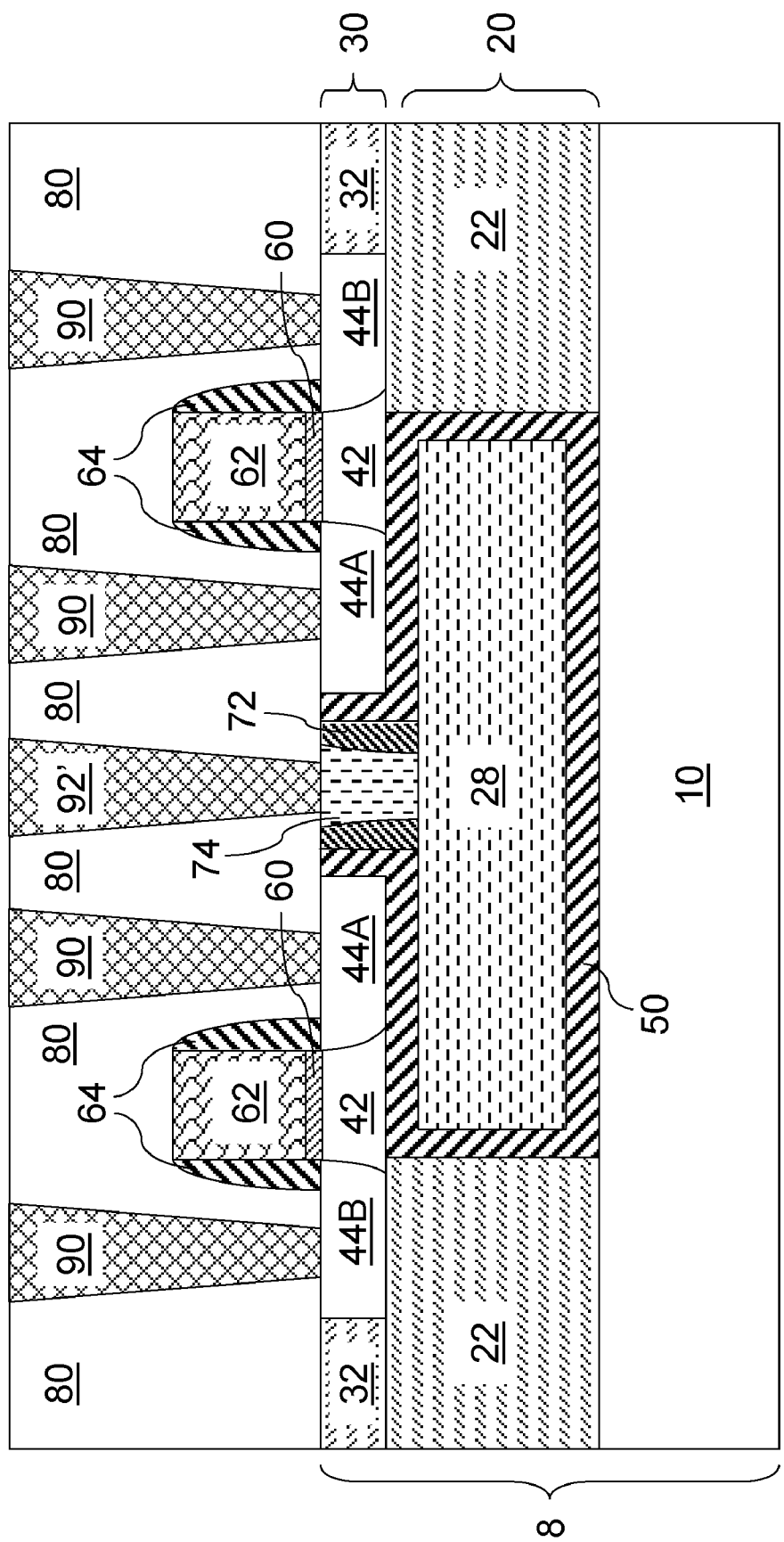
FIG. 16 shows a third variation on the second exemplary semiconductor structure according to the present invention.

Referring to FIG. 16, a third variation of the second exemplary semiconductor structure is shown, in which the first source/drain regions 44A and portions of the body regions 42 overlie the back gate electrode 28. However, the second source/drain regions 44B do not overlie the back gate electrode 28. Thus, although the effect of the bias applied by the back gate electrode 28 on the second source/drain regions 44B is reduced compared to the structure of FIG. 15, parasitic capacitance of second source/drain regions 44B is also reduced, which may improve performance.

Figure 17:
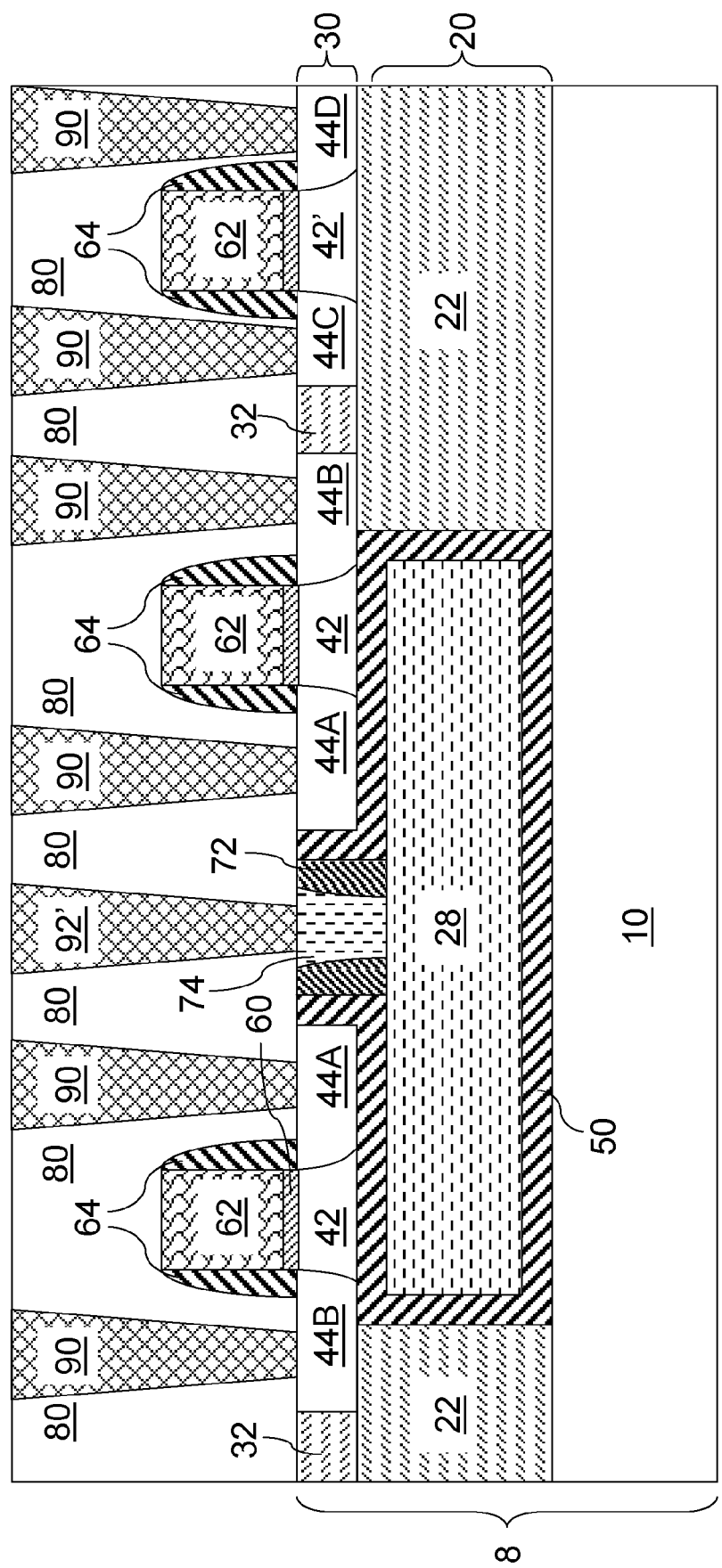
FIG. 17 shows a third exemplary semiconductor structure according to the present invention.

Referring to FIG. 17, a third exemplary semiconductor structure is shown according to a third embodiment of the present invention. The third exemplary semiconductor structure may be formed employing the same methods as the second embodiment, while forming an additional field effect transistor formed over the buried insulator portion 22 that is located within the portion of the SOI substrate 8 that is blocked by the masking layer 37 during the processing steps corresponding to FIGS. 3-5. The formation of the additional field effect transistor may be effected by reserving an area for such a transistor by covering the area with the masking layer 37. The additional field effect transistor is a typical SOI field effect transistor that may be subject to typical floating body effects. The additional field effect transistor comprises an SOI source region 44C, an SOI drain region 44D, and a floating body 42' that are typical of SOI field effect transistors known in the art. Such a typical SOI field effect transistor may be advantageously employed in a circuit requiring a combination of such a typical SOI field effect transistor and a field effect transistor requiring modulating of the body for performance enhancement. Thus, the present invention provides a semiconductor structure containing both a conventional SOI field effect transistor having typical floating body effects and the inventive field effect transistor having a back gate electrode 28 that applied a back modulation to the body and the first source/drain regions 44A (which may be source regions or drain regions).

Figure 18:
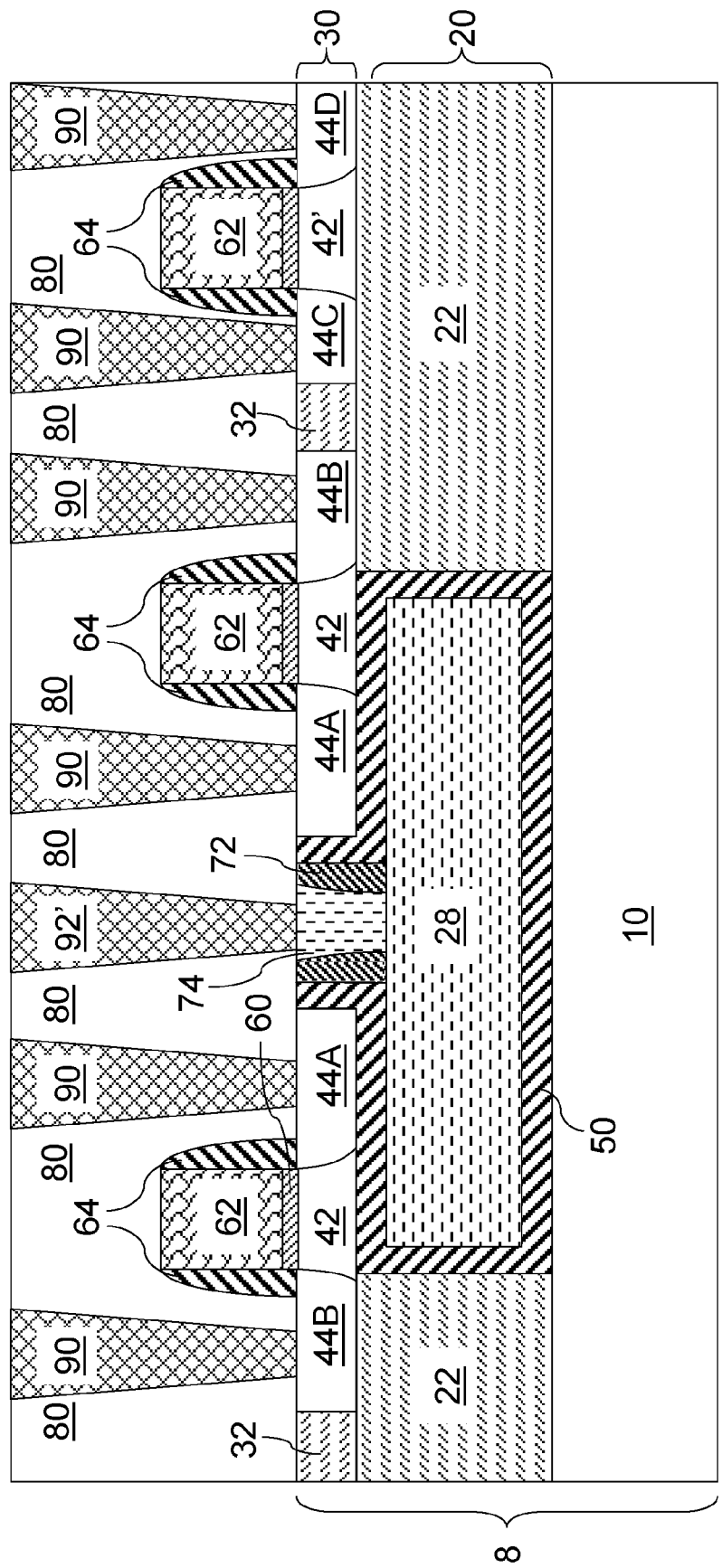
FIG. 18 shows a variation of the third exemplary semiconductor structure according to the present invention.

Referring to FIG. 18, a variation of the third exemplary semiconductor structure is shown, in which the first source/drain regions 44A and portions of the body regions 42 overlie the back gate electrode 28. However, the second source/drain regions 44B do not overlie the back gate electrode 28. Thus, the effect of the bias applied by the back gate electrode 28 on the second source/drain regions 44B is reduced compared to the structure of FIG. 17, but parasitic capacitance of second source/drain regions 44B is also reduced, which may improve performance.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A semiconductor structure comprising:
   a handle substrate;
   a buried insulator portion having at least one hole and located directly on said handle substrate;
   a field effect transistor comprising a source region, a drain region, and a body region that are located in a top semiconductor portion that vertically abuts said buried insulator portion;
   a dielectric layer located in said hole and abutting said body and one of said source region and said drain region;
   a back gate electrode abutted and surrounded by said dielectric layer; and
   a conductive contact via abutting said back gate electrode.

2. The semiconductor structure of claim 1, further comprising a shallow trench isolation structure abutting the other of said source region and said drain region.

3. The semiconductor structure of claim 1, wherein said back gate electrode comprises a doped semiconductor material having a doping of p-type or n-type.

4. The semiconductor structure of claim 1, further comprising a dielectric material plug vertically abutting said back gate electrode and surrounding said conductive contact via, wherein said conductive contact via extends below a depth of a bottom surface of said dielectric material plug.

5. The semiconductor structure of claim 1, further comprising a conductive material plug located between and vertically abutting said back gate electrode and said conductive contact via.

6. The semiconductor structure of claim 5, further comprising a dielectric spacer laterally abutting inner sidewalls of said dielectric layer and outer sidewalls of said conductive material plug.

7. The semiconductor structure of claim 1, wherein said dielectric layer abuts a portion of the other of said source region and said drain region.

8. The semiconductor structure of claim 1, wherein said dielectric layer is disjoined from the other of said source region and said drain region.

9. The semiconductor structure of claim 1, wherein said dielectric layer is contiguous and topologically homomorphic to a bottle with one opening, wherein an opening of said dielectric layer is located at a surface that is substantially coplanar with a top surface of said top semiconductor portion.

10. A semiconductor structure located in a semiconductor-on-insulator (SOI) substrate and comprising a first field effect transistor and a second field effect transistor therein, wherein said SOI substrate comprises a handle substrate and a buried insulator portion having at least one hole and located directly on said handle substrate, wherein said first transistor comprises:

a first source region, a first drain region, and a first body region that are located in a first top semiconductor portion abutting said buried insulator portion;

a dielectric layer abutting said first body, one of said first source region and said first drain region, said first buried insulator portion, and said handle substrate;

a back gate electrode abutted and surrounded by said dielectric layer; and a conductive contact via abutting said back gate electrode, and wherein said second transistor comprises a second source region, a second drain region, and a second body region that vertically abut said buried insulator portion and are located in a second top semiconductor portion, wherein said second top semiconductor portion is disjoined from said first top semiconductor portion and from said dielectric layer.

11. The semiconductor structure of claim 10, wherein said back gate electrode comprises a doped semiconductor material having a doping of p-type or n-type.

12. The semiconductor structure of claim 10, further comprising a dielectric material plug vertically abutting said back gate electrode and surrounding said conductive contact via, wherein said conductive contact via extends below a depth of a bottom surface of said dielectric material plug.

13. The semiconductor structure of claim 10, further comprising a conductive material plug located between and vertically abutting said back gate electrode and said conductive contact via.

14. The semiconductor structure of claim 13, further comprising a dielectric spacer laterally abutting inner sidewalls of said dielectric layer and outer sidewalls of said conductive material plug.

* * * * *